(12) United States Patent
McGrath

(10) Patent No.: US 6,259,389 B1
(45) Date of Patent: Jul. 10, 2001

(54) SYSTEM FOR DESIGNING AND TESTING A SIGMA-DELTA MODULATOR USING RESPONSE SURFACE TECHNIQUES

(75) Inventor: Donald Thomas McGrath, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/306,026

(22) Filed: May 6, 1999

Related U.S. Application Data
(60) Provisional application No. 60/109,296, filed on Nov. 20, 1998.

(51) Int. Cl.$^7$ ............................... H03M 1/10; H03M 1/06

(52) U.S. Cl. ........................... 341/120; 341/118; 341/143

(58) Field of Search ............................... 341/120, 118, 341/143, 141, 122, 127, 166

(56) References Cited

U.S. PATENT DOCUMENTS
| | | | |
|---|---|---|---|
| 4,419,656 | * 12/1983 | Sloane | 341/120 |
| 4,641,246 | * 2/1987 | Halbert | 341/163 |

OTHER PUBLICATIONS

"A 15b 30kHz Bandpass Sigma–Delta Modulator," Lorenzo Longo, Bor–Rong Horng, 1993 IEEE International Solid–State Circuits Conference, pp. 226–227 & 293.

"The Design of Sigma–Delta Modulation Analog–to–Digital Converters," Bernhard E. Boser, IEEE Journal of Solid–State Circuits, vol. 23, No. 6, Dec. 1998, pp. 1298–1308.

"Fundamental Limitations of Switched–Capacitor Sigma–Delta Modulators," VF Dias; G. Palmisano, P. O'Leary, F. Malobeti, IEEE Proceedings–G, vol. 139, No. 1, Feb. 1992, pp. 27–32.

"Application of Genetic Algorithm for Response Surface Modeling in Optimal Statistical Design," Y. Shen, R.M.M. Chen, IEEE 1995, pp. 2152–2155.

Bishop et al, "Table–Based Simulation of Delta–Sigma Modulators," IEEE, 447–451, Mar. 1990.*

Jesper Steensgaard, "Nonlinearities in SC Delta–Sigma A/D Converters," IEEE, 355–358, Sep. 1998.*

* cited by examiner

*Primary Examiner*—Patrick Wamsley
(74) *Attorney, Agent, or Firm*—John F. Thompson; Jill M. Breedlove

(57) ABSTRACT

The present invention provides a method and apparatus which uses data containing non-linearity information regarding the integrator circuits used in over-sampled Analog-to-Digital Converters to predict the Signal-to-Distortion Ratio and the Signal-to-Noise Ratio. Input response data used to evaluate the device is either obtained from simulations when designing the integrator circuit, or in situ testing of the integrators when testing an over-sampled Analog-to-Digital Converter integrated circuit. The non-linearity data can be generated by simulating or testing the Analog-to-Digital Converter circuit for several hundred clock cycles and measuring the inputs and outputs of each integrator. This data is used to predict the Signal-to-Distortion Ratio and the Signal-to-Noise Ratio.

45 Claims, 13 Drawing Sheets

SYSTEM FOR DESIGNING AND TESTING A SIGMA-DELTA MODULATOR USING RESPONSE SURFACE TECHNIQUES

RELATED APPLICATIONS AND PATENTS

This application claims the benefit of provisionally filed U.S. patent application, Ser. No. 60/109,296, entitled, "Sigma-Delta Modulator From Integrator Non-linearity Using Response Surface Methods", filed on Nov. 20, 1998, assigned to the assignee of the present invention, and herein incorporated by reference.

BACKGROUND OF THE INVENTION

This invention relates to the testing and design of integrator based analog-to-digital converter circuits, and more particularly to a method of designing and testing a sigma-delta based analog-to-digital converter circuit using optimized polynomial representations of the non-linearity of the transfer function of the circuit to predict the signal-to-noise ratio (SNR) and the signal-to-distortion ratio (SDR).

The timely design of integrated circuits for economical and reliable insertion into products and systems requires design methodologies which increase the likelihood of obtaining the required performance with little or no design iteration. Operation is required at the designed level of performance over manufacturing tolerances, and over expected environmental and operational conditions. Computer aided design (CAD) methods are used extensively in integrated circuit (IC) design to increase the robustness to variations in manufacturing tolerances as well as environmental and operational conditions. Enhanced CAD tools that enable rapid and verifiable product designs are a critical need to maintain the pace of productivity enhancement in IC development.

Semiconductor manufacturing processes have inherent limitations in the tolerances that can be maintained on key parameters important for analog and digital integrated circuit design. Limitations in lithography cause uncertainty in device geometry such as metal-oxide semiconductor (MOS) transistor length and width which determine amplifier gain-bandwidth and logic drive strength. Variability in oxide growth rate contributes to variable oxide thickness which in turn causes variability in transistor capacitance and transconductance. Uncertainties in doping profiles on implants and diffusions cause variance in resistor values as well as transistor parasitic capacitance. The circuit impact of these manufacturing tolerances must be considered when designing integrated circuits.

Once in a product or system, an integrated circuit must maintain the required level of performance over all expected conditions including temperature excursions, variations in power supply voltage, and fluctuations in input signal integrity. Since test of each chip produced over all expected environmental or operational condition is impractical, consideration of variations is critical in design of robust, reliable integrated circuits. To design an integrated circuit for robustness with respect to the always present variations, requires simulation of the circuit over the ranges of these variations. This task is reasonable for circuits such as op-amps, comparators, switches, and logic gates whose performance can be evaluated in direct time-domain simulations taking seconds, minutes, or hours. When the simulations require days or more to run on the fastest engineering workstations, the design cycle becomes too long to practically meet the market demands for the technology. In situations where direct circuit simulations are impractical, other CAD methods must be employed.

Design of complex, mixed analog-digital integrated circuits poses challenges to designers, and places strong demands on CAD tools. Circuits such as analog-to-digital converters (ADCs), digital-to-analog converters (DACs), and phase-lock loops (PLLs) are examples of circuits which challenge direct time-domain simulation. The common feature of these circuits is that the circuits resist linearization since they operate in several different linear and non-linear regimes. The result is complex transient behavior which requires time-domain simulation with a fine time-step.

With the advent of the introduction of computers into most products and systems, the need for circuits to interface between our analog world and the digital world of the computer has increased dramatically. The growing need for high performance, low power, and low cost electronic systems has resulted in the invention of many elegant ADC circuits. As the resolution increases, more power is required to increase the sample rate. The decreasing efficiency with resolution is related to difficulties associated with component matching and absolute voltage and current accuracy required, which are limited by semiconductor process technology and power supply levels. When resolutions increase, circuit complexity increases to compensate for the limitations in component matching and accuracy limits. The circuit complexity increases the power consumption accordingly.

The low resolution ADCs are typically pipelined or folded flash architectures. The high resolution converters are typically dual-slope, successive approximation, or sigma-delta architectures. The sigma-delta architecture is capable of attaining high resolution analog-to-digital conversion with moderate sample rates and low power consumption in a CMOS process, and this makes it attractive for integration into mixed analog-digital circuits. The sigma-delta modulator uses oversampling of the input signal combined with low resolution quantization and digital filtering to accomplish analog-to-digital conversion. The oversampling of the low bandwidth signal poses a particularly difficult problem in circuit simulation of sigma-deltas. High accuracy analog simulations need to be run for many sample periods to evaluate the result of conversion after digital filtering. Simulations in a circuit simulator, such as SPICE™, may take days for a single case, with the simulated performance perhaps limited to less than 15 bits due to rounding and truncation errors which accumulate over the large number, possibly millions, of time steps required for accurate simulation.

Several CAD methods for the simulation of sigma-delta modulators have been developed. The existing methods are useful in determining the performance of subcircuits required to achieve a desired level of performance, or to verify the performance once all the subcircuits have been designed. However, a methodology which is useful in optimizing the subcircuit designs is clearly lacking. A methodology which can quickly and easily estimate the sigma-delta performance given simulation data of the subcircuits could be used in the automated optimization of the subcircuits and lead to shorter design cycles and more robust designs. As such, a sigma-delta method is desired which does not rely on simulation of the sigma-delta loop in order to evaluate the SNR and SDR of a modulator instance.

Simulation and testing of over-sampled analog-to-digital converters (ADCs) requires the simulation or acquisition of thousands of consecutive samples in order to determine resolution and linearity. Typically the ADC is run for 16K to 64K clock cycles and an Fast Fourier Transform (FFT) performed on pre-decimated or post-decimated samples.

The signal-to-noise ratio (SNR) and signal-to-distortion ratio (SDR) are computed from the FFT spectrum. The long time-domain modulator simulations consume significant design time. Testing a multi-channel ADC over several operational conditions using this method adds substantial cost to the integrated circuit. As such, it is desirable to reduce the test time so as to improve design optimization.

BRIEF DESCRIPTION OF THE INVENTION

The present invention provides a method and apparatus which uses data containing non-linearity information regarding integrator circuits in over-sampled Analog-to-Digital Converters (ADCs) to predict the Signal-to-Distortion Ratio (SDR) and Signal-to-Noise Ratio (SNR). The present invention determines the non-linearity and non-ideology of an analog-to-digital device under test, the device under test having at least one integrator, a respective non-linear integrator model, and non-linearity parameters. The present invention includes the following steps: generating a model data set from a plurality of simulations of the analog-to-digital device under test employing the respective non-linear integrator model; generating an n-dimensional prediction equation corresponding to the model data set; measuring the input response of each respective non-linear integrator to generate a respective input response test data set; generating a plurality of numerical values for the non-linearity coefficients in the non-linear integrator model from the respective test data set; and determining the acceptability of the SDR and SNR by solving the prediction equation using the plurality of numerical values as input data to the prediction equation.

DETAILED DESCRIPTION OF THE INVENTION

Figure 16:
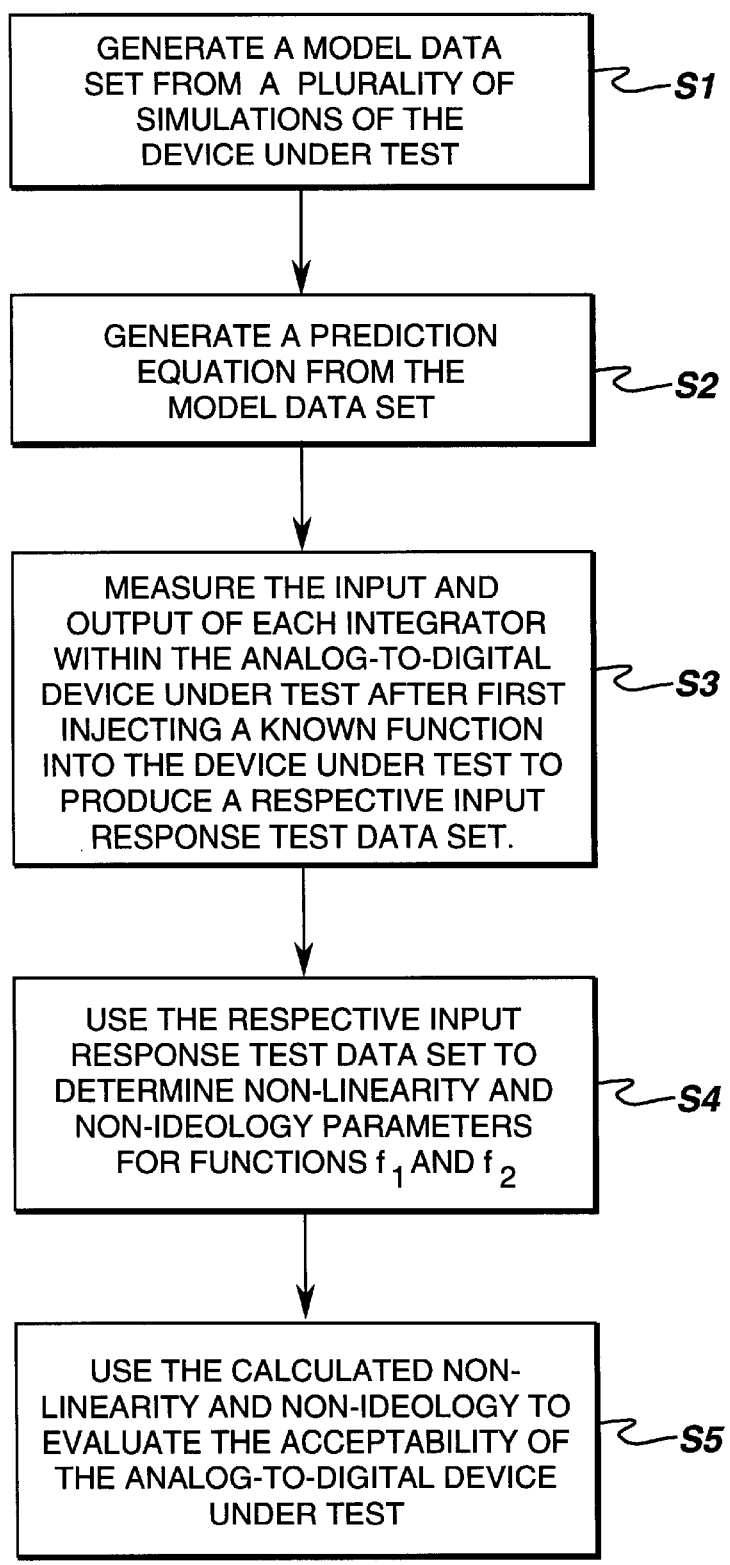
FIG. 16 is a flow diagram for determining the SNR and SDR of the present invention.

Referring now to the drawings, wherein like numerals represent like elements throughout. The present invention, depicted in the flow diagram 50 in FIG. 16, is described most broadly in the following five steps:

S1. Generate a model data set based on a plurality of simulations of the analog-to-digital device under test.

S2. Generate a prediction equation from the model data

S3. Measure, in parallel, the input and output of each integrator in the analog-to-digital device to generate a input response test data set. The measurements may also be made serially.

S4. Use the input response test data set gathered to determine the non-linearity coefficients which define the non-linearity and non-idealities for the functions $f_1$ and $f_2$, where $f_1$ is representative of the sampling non-linearity function and $f_2$ is representative of the integration distorting function.

S5. Use the calculated non-linearity and non-ideality to predict the performance characteristic of the analog-to-digital device, as defined by the signal-to-noise ratio and the signal-to-distortion ratio.

In one embodiment, these steps may be used to evaluate the acceptability of the device as an analog-to-digital device under test. In another embodiment, these steps may be used to evaluate the analog-to-digital device, as a simulation of an integrator based analog-to-digital design, so as to optimize the performance of the analog-to-digital design.

The functions $f_1$ and $f_2$ are developed from simulations of the integrator portion of the device. Function $f_1$ is related the input voltage ($v_{in}$) to the device as illustrated in equation (1), $$f_1(v_{in}) = \alpha_0 v_{in} + \alpha_1 v_{in}^2 + \alpha_2 v_{in}^3 + \ldots \quad (1)$$

where $\alpha_n$ are "n" constants chosen to produce the best curve fit, and "n" is a number equal to the total number of constants identified and equal to the number of integrators in the device.

Function $f_2$ is related to the input voltage ($v_{in}$) to the device as illustrated in equation (2), $$f_2(v_{in}) = \beta_0(v_{in} - v_{ref}) + \beta_1(v_{in} - v_{ref})^2 + \beta_2(v_{in} - v_{ref})^3 + \ldots \quad (2)$$

where $v_{ref}$ is the reference voltage from the output of a respective integrator, and where $\beta_n$ are "n" constants chosen to produce the best curve fit. MATLAB™ is, for example, a commercially available math function that generates polynomial coefficients that define a least squares fit polynomial for a set of input values. MATLAB may be used to generate coefficients $\alpha_n$ and $\beta_n$.

The Signal-to-distortion (SDR) ratio and Signal-to-noise (SNR) ratio is determined by the following steps.

1. Determine the points along the perimeter of the of the modeled SDR.

2. Set a range of the acceptable limits around a tolerance shell of the modeled SDR.

3. Determine the data that is representative of the contour of the SDR.

4. Calculate the average SDR value for the test device.

5. If the average SDR value is within the range of acceptable limits of the modeled SDR then the SDR of the device is acceptable.

6. Repeat steps 1 through 5 for the SNR.

The method identified above describes, at a high level, methods which uses data containing non-linearity and non-ideology information regarding the integrator circuits used in over-sampled Analog-to-Digital Converters (ADCs) to predict the Signal-to-Distortion Ratio (SDR) and Signal-to-Noise Ratio (SNR) of the present invention.

SOFOC2 Third Order Modulator

Figure 3:
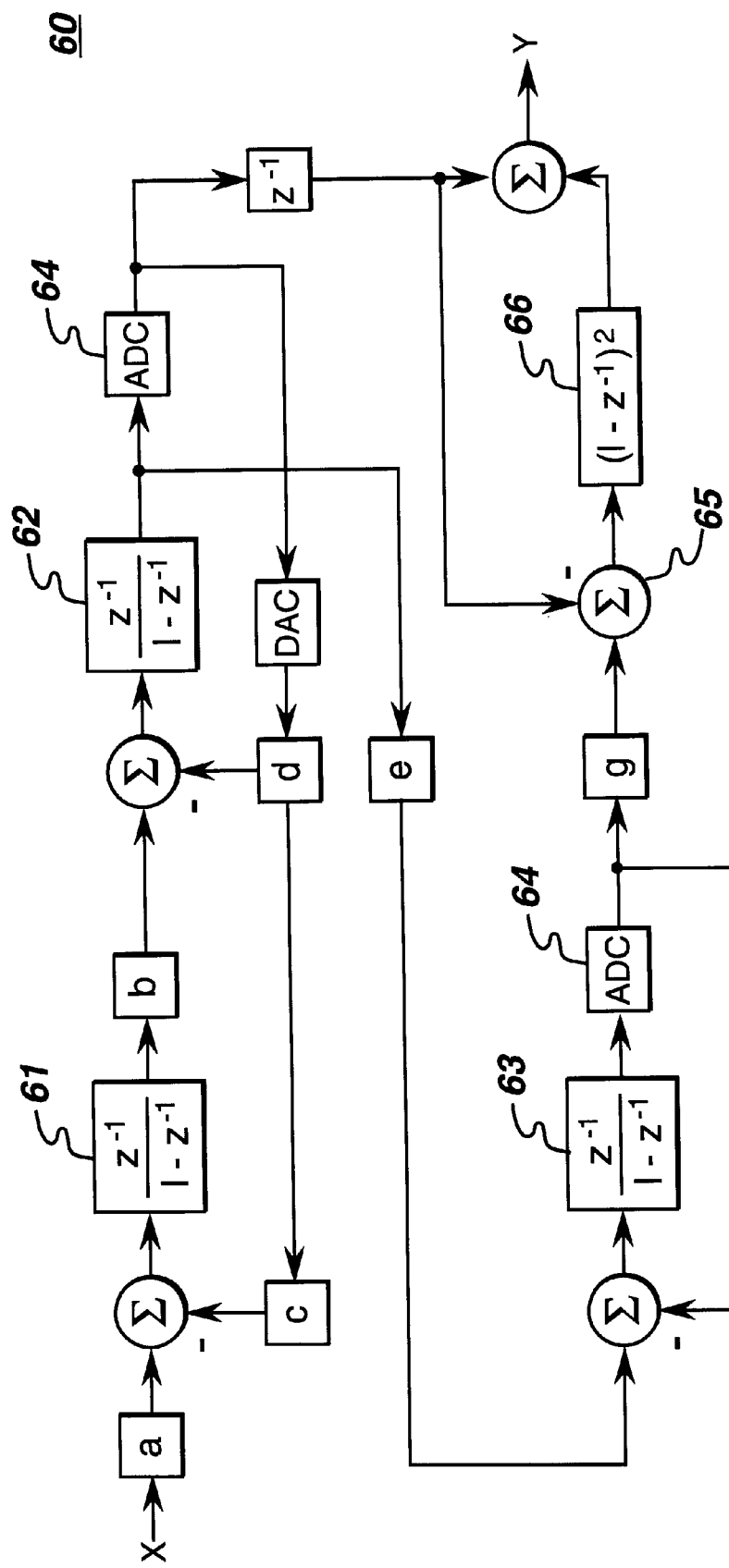
FIG. 3 is a schematic block diagram of a second order, first order cascade (SOFOC2), third order sigma-delta modulator.

It is first necessary to generate a simulation of the non-linear integrator function of the device under test. A second order first order cascade modulator architecture has been demonstrated to be effective for predicting the non-linear performance of the integrator based device. Prior art exists which define second order first order cascade modulator architecture (SOFOC2) 60, for third order modulation, as illustrated in FIG. 3. The SOFOC2 modulator 60 was chosen because it is unconditionally stable, is tolerant to capacitor mismatch of about 5%, and tolerant to finite op-amp gain. A maximum value for input signal "X" can be within about 3 dB of the reference voltage without simulation overloading.

SOFOC2 modulator 60 generates an output signal "Y" which is a quantized version of the input signal "X" plus third order shaped quantization noise. The following is a description of the noise shaping technique employed by modulator 60. A first stage second order modulator 61 produces a digital output which represents the input signal, second order shaped quantization noise, plus the additive quantization noise of the current sample. The input to a second stage first order modulator 62 represents the signal and second order shaped quantization noise before the addition of the quantization noise of the current sample. The output of second stage first order modulator 62 is the signal plus second order shaped quantization noise from the first stage, as well as first order shaped quantization noise from the second stage quantizer. After scaling, the outputs of the two quantizers are subtracted at a summer 65 to yield a signal which is the negative of the additive quantization noise of the present sample. This signal is then doubly differentiated at a differentiator 66 to produce the negative of the second order shaped quantization noise of the present sample plus third order shaped quantization noise 63 from the second stage quantizer. The resulting signal is used to cancel the second order shaped noise coming out of the first stage two samples later. The result of this entire process is a quantized signal "Y" which is representative of the input signal plus third order shaped quantization noise.

Figure 4:
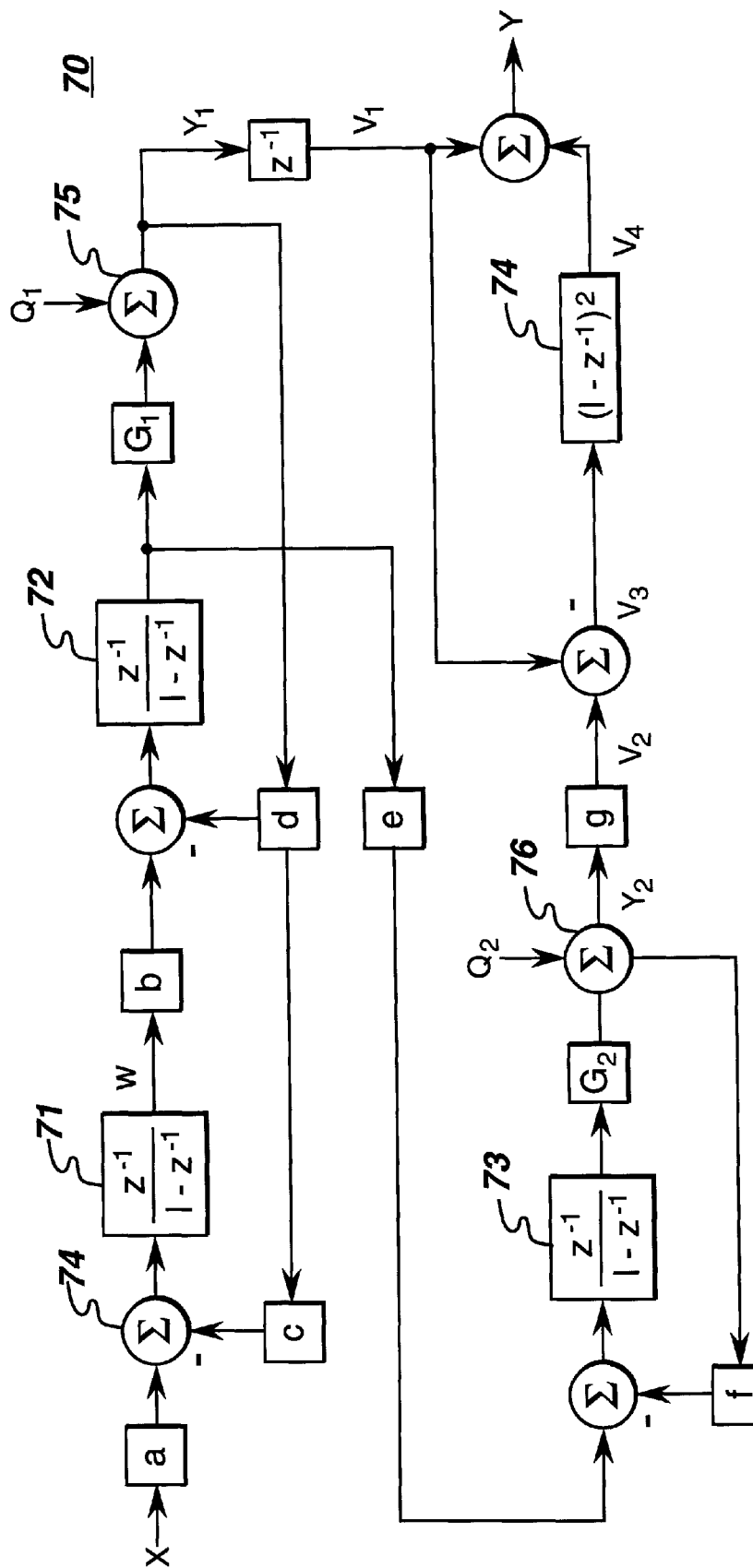
FIG. 4 is a schematic block diagram of a second order, first order cascade (SOFOC2), third order sigma-delta modulator with linearized quantizers.

A schematic block diagram circuit 70, illustrated in FIG. 4, contains three model capacitor integrators also referred to as switched capacitor integrators 71, 72, and 73, and two one-bit quantizers 75 and 76. The resulting two bits are combined digitally and a digital filter is used to perform low-pass filtering and decimation to a lower data rate. Since quantizer 75 in the first stage is proceeded by two integrators 71 and 72, the quantization noise can become large as the input approaches full scale. The quantization noise exceeding the input range of the second stage results in a severe decrease in performance known as instability or overload. Scaling factors "a" through "g" limit the range of the integrator outputs and keep the loop stable. These scaling coefficients need to meet certain criteria in order to maintain the desired noise shaping. The following analysis is used to define the selection criteria for coefficients "a"–"g".

The signal following the first integrator (W) is shown in equation (3). Due to the arbitrary gain which can be associated with one-bit quantizer 75, the scaling factor $G_1$ is inserted before the second quantizer 72. The output "W" of the first stage can be written as in equation (4) including the added quantization noise $Q_1$.

Linearized Quantizers and Arbitrary Scaling Before Quantizers.

$$W = \frac{(aX - cY_1)z^{-1}}{1 - z^{-1}} \quad (3)$$

$$Y_1 = \frac{(bW - dY_1)z^{-1}}{1 - z^{-1}} \quad (4)$$

$$= G_1\left[\frac{(abX - bcY_1)z^{-1}}{1 - z^{-1}} - dY_1\right]\frac{z^{-1}}{1 - z^{-1}} + Q_1$$

Manipulation of equation (4) yields the expression in equation (5). In order to implement third order noise shaping, the expression in the parentheses on the left side of equation (5) must be equal to unity, while the coefficients associated with "X" on the right side of equation (5) must also equal unity. This requirement causes $G_1ab$ to be equal to unity, $G_1d$ to equal two, and $G_1bc$ to equal one. One set of coefficients which satisfies these conditions as well as restricting integrator output signals to reasonable levels is a=1/6, b=1/4, c=1/6, and d=1/12. The result is the transfer function shown in equation (6).

$$Y_1(1+(G_1d-2)z^{-1}+(G_1bc+1-G_1d)z^{-2})=G_1abXz^{-2}+Q_1(1-z^{-1})^2 \quad (5)$$

$$Y_1=Xz^{-2}+Q_1(1-z^{-1})^2 \quad (6)$$

Following the same procedure as used for analyzing the first stage, the expression for the output from the second stage is shown in equation (7). If the product of f and $G_2$ is equal to one, equation (7) reduces to equation (8). After digital scaling and subtraction of $V_1$ the resulting signal $V_3$ is given in equation (9) if the product of "g", "e", and $G_2$ is equal to $G_1$. After $V_3$ is doubly differentiated by a differentiator 74 and added to $V_1$, the final quantized output signal "Y" is shown in equation (10). The result is a delayed version of the input signal "X" plus the quantization noise from the second quantizer multiplied by "g". The values of "e", "f", and "g" are chosen to be 1/3, 1/18, and 4 since it is easy to realize a factor of four multiplication in the digital domain by a shift operation, and these values allow the signal levels in the third integrator to be in the range such that modulator 70 does not overload. The multiplication of the quantization noise by a factor of four results in a loss of 2-bits compared to the ideal third order modulator. The stable operation of modulator 70 and its tolerance to capacitor mismatch and finite op-amp gain are traded against the two-bit loss in dynamic range.

$$Y_2 = \frac{\left[(Y_1 - Q_1)\frac{e}{G_1} - fY_2\right]G_2z^{-1}}{1 - z^{-1}} + Q_2 \quad (7)$$

$$Y_2=(Y_1-Q_1)eG_2/G_1z^{-1}+Q_2(1-z^{-1}) \quad (8)$$

$$V_3=gQ_2(1-z^{-1})-Q_1z^{-1} \quad (9)$$

$$Y=gQ_2(1-z^{-1})^3-Xz^{-3} \quad (10)$$

The SOFOC2 architecture 70, illustrated in FIG. 4, has been successfully implemented. The target modulator is clocked at about 5.12 MHz, and with an oversampling ratio of 128 yields a resolution of 16-bits for a signal bandwidth of about 20 KHz.

Signal-To-Distortion Response

Sampling methods were applied to the problem of sampling the integrator non-linearity space of the SOFOC2 sigma-delta modulator with the goal of determining an SDR prediction equation.

The approach was to use a sigma-delta difference equation simulator employing the non-linear integrator model to generate random modulator instances on an equi-SDR surface to which a surface equation is fit.

The input signal to modulator 70 which was modeled by the difference equation simulator, was a sine-wave with a frequency in the post-decimation base-band and amplitude 3 dB below the voltage reference level. The SNR of SOFOC2 modulator 70 begins to decrease at this input signal level due to overload, and is thus the maximum useable input amplitude. The input frequency was chosen to correspond with bin 32 of the FFT, such that up to the $15^{th}$ harmonic corresponds with the base-band frequency.

The digital output "Y" of modulator 70 in FIG. 4, was processed using an FFT routine after widowing by a Hanning window to minimize FFT end effects. To obtain reasonable resolution in the base-band frequency, 65,536 modulator 70 output samples were generated. To eliminate the effect that the decimation filter roll-off has on the harmonics generated by distortion, a decimation filter was not used. After filtering in the frequency domain using an ideal brick-wall filter representing decimation by 128, 512 points remained to represent the base-band spectrum. The above described filtered digital output is also referred to in this specification as a model data set.

Figure 6:
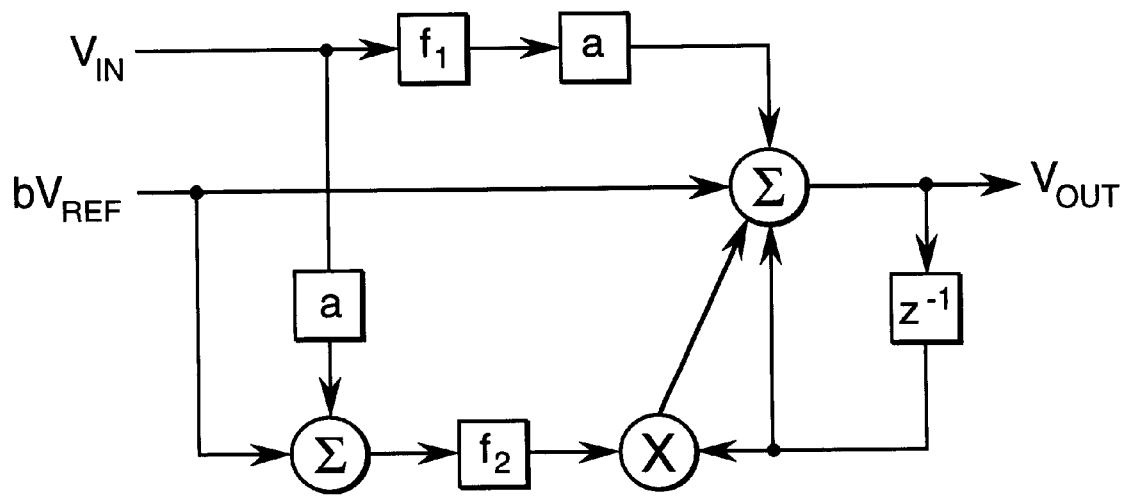
FIG. 6 is a block diagram of a non-linear integrator model used in the present invention.

A non-linear integrator model 110 is shown in FIG. 6, and the form of the $f_1$ and $f_2$ distorting functions are given below.

$$f_1(x)=a_{n1}(2x^2-1)+a_{n2}(4x^3-3x)+a_{n3}(8x^4-8x^2+1) \quad (11)$$

$$f_2(x)=a_{n4}x+a_{n5}(2x^2-1)+a_{n6}(4x^3-3x)+a_{n7}(8x^4-8x^2+1) \quad (12)$$

The subscript "n" is used to identify which of the three integrators the non-linearity coefficient is associated with. There are three coefficients for each integrator associated with the input sampling non-linearity $f_1$. The linear term is omitted from the input sampling distortion function since it has the same effect as scaling the reference which has little impact on distortion and quantization noise. There are four coefficients for each integrator associated with the $f_2$ integration distorting function in this example. There are a total of 21 non-linearity coefficients for SOFOC2 modulator 70 (FIG. 4) with non-linear integrators 71, 72, and 73.

In order to eliminate unnecessary complexity from the surface fit, only the non-linearities of the first integrator 71 were considered. This simplification reduced the number of parameters from 21 to 7, and resulted in a genetic algorithm iteration time of tens of seconds on a SPARC-20υ workstation. The simplification has insignificant impact in the surface fit since the non-linearities of the second 72 and third integrators 73 are not expected to contribute significantly to distortion.

The SOFOC2 difference equation simulator with non-linear integrators described above was used with the linear search sampling method. The samples reside in a near equi-SDR region of the seven parameter space formed by non-linearity coefficients $a_{11}$ through $a_{17}$. One example range of the near equi-SDR region was 96.5+/−0.5 dB since 96 dB corresponds to the desired 16-bit linearity. Each sample resulting from the linear search sampling method consisted of the values of the seven parameters and the resulting SDR.

Figure 5:
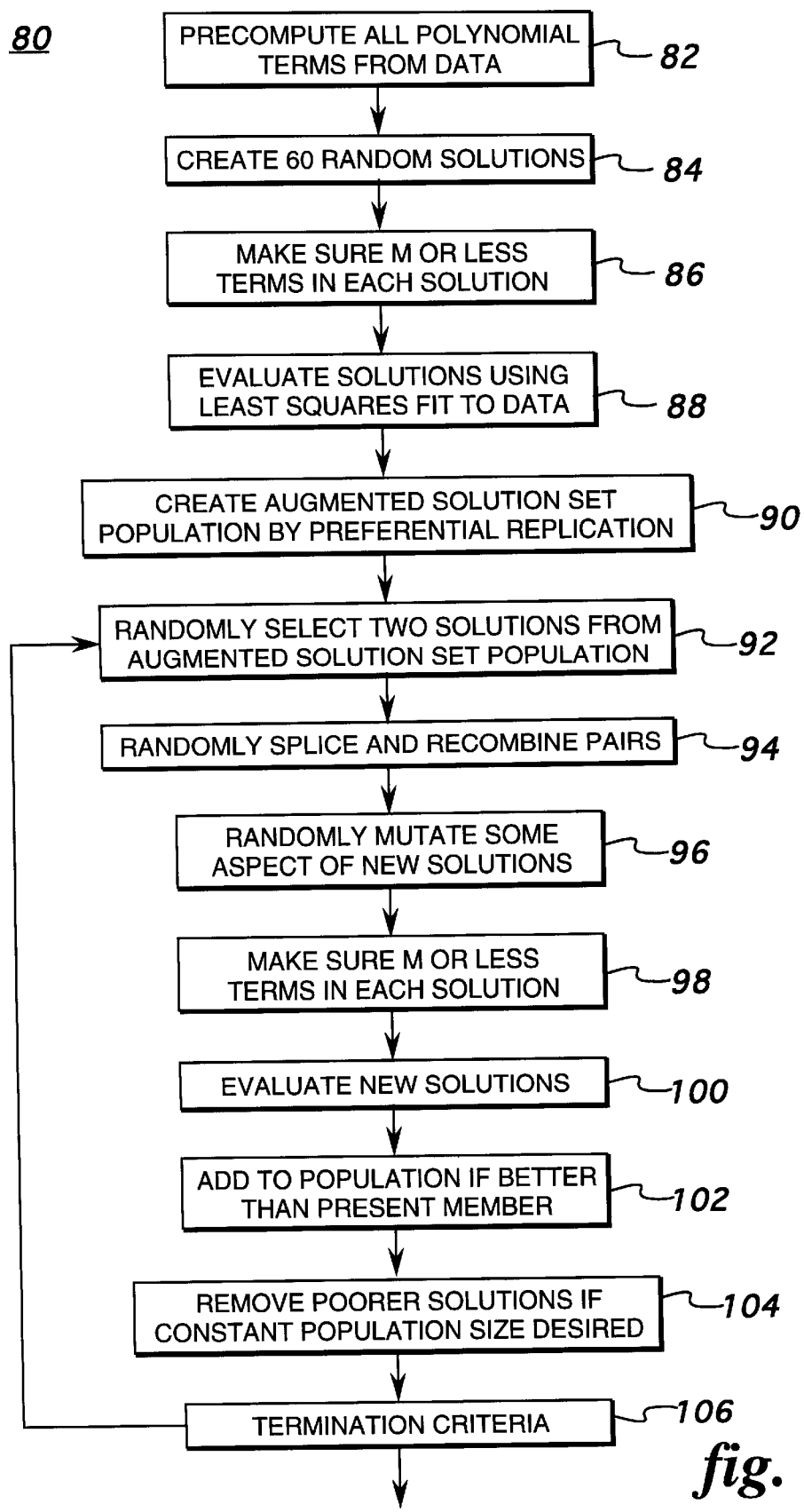
FIG. 5 is a flow diagram of a genetic algorithm used in the present invention.

A genetic algorithm surface fit algorithm 80, illustrated in FIG. 5, was used to determine a quadratic surface equation from 2000 modulator instances generated by the simulator. Genetic algorithm 80 comprises the following steps: pre-compute all polynomial terms from model data set 82; create a fixed number of random solutions (e.g. 60) 84; make sure "M" or less terms are in each solution 86; evaluate the solutions using least squares fit to data 88; create augmented solution set population by preferential replication 90; randomly select two solutions from the solution set population 92; randomly splice and recombine pairs 94; randomly mutate some aspect of new solutions 96; make sure "M" or less terms are in each solution 98; evaluate the new solutions 100; add each new solution to the population if the respective new solution is better than present member 102; remove poorer solutions if a constant population size is desired 104; and define termination criteria 106.

In one exemplary embodiment the maximum number of terms "M" was constrained to 24 to keep iteration time reasonable. The SDR numbers were converted from decibels to a linear scale for the curve fit. This conversion improves the numerical accuracy of the fit since it expands the 96–97 dB range to a range of 63,096 to 70,095. The coefficients $a_{11}$ through $a_{17}$ were scaled by $10^6$ before being used in the fit to minimize the effects of truncation in the MATLAB™ code used in the genetic algorithm surface fit. The form of the prediction equation in this example is shown in equation (13). The quadratic function of the scaled coefficients $a_{11}$ through $a_{17}$ represents a degradation in the SDR of 118 dB (794,328) for SOFOC2 modulator 70 with ideal integrators at an oversampling ratio of 128. The ratio of the sample rate to the down-sampled data rate is known as the decimation ratio or oversampling ratio (OSR).

$$SDR=794,328-f(a_{11},a_{12},a_{13},a_{14},a_{15},a_{16},a_{17})+B \quad (13)$$

The fitting parameter "B" compensates for the offset in the best fit line which maximizes the correlation coefficient between SDR from simulation and SDR predicted by equation (13). The algorithm was run until no improvement was observed in the correlation coefficient (R) between the SDR from simulation and the surface equation SDR estimate. The result was a set of at most 24 polynomial terms and associated numeric coefficients which maximize the correlation coefficient.

The correlation coefficient is used as the fit metric since the surface equation will be extrapolated outside the region of the fit to include a tolerance shell, and the correlation coefficient is a measure of the variation in the data that is accounted for by the surface equation. The mean-square error was initially used as the fit metric, but the resulting solution was not as good as when correlation coefficient is used. The reason that correlation coefficient is a better fit metric than mean-squared error is that the response of the modulator SDR to changes in non-linearity is not quadratic and can only be fit by a quadratic equation at a single point.

The initial solution set population of the improvement in genetic algorithm 80 (FIG. 5) contained a good solution such that the improvement in the best solution was minor, converging to R=0.86 in 200 generations. A near-best solution is likely to exist in the initial solution set population since there are four terms which dominate the fit and a solution set population of 60 solutions, each with 24 terms, will likely contain one solution with the four dominant terms. The linear search sampling method will be shown to under-sample part of the parameter space such that certain features are not represented by the data and thus cannot be fit. The data does not contain information on fine features necessary for accurate SDR prediction over the expected range of coefficients $a_{11}$ through $a_{17}$. The lack of the fine features makes finding the best fit easy since four terms dominate the response. The mean value of "R" for the solution set population increases monotonically with generations as the characteristics of the best solution proliferates all solutions until the solution set population is homogeneous.

The best solution consisted of the 14 terms and associated coefficients illustrated in Table 4.1. The non-linearities associated with input sampling ($a_{11}$, $a_{12}$, and $a_{13}$) have the largest impact on SDR, as evidenced by the relative magnitude of the coefficients associated with the quadratic terms of these parameters. The interaction between the quadratic and fourth-order terms of the n-dimensional Chebychev polynomial function associated with $a_{11}$ and $a_{13}$ is also significant. The interaction is due to the presence of a squared term in the first and third non-linear terms of the Chebychev polynomial as shown in equation (11). Domination of the SDR by the coefficients of $f_1$ is not unexpected since the signal seen by the $f_2$ distorting function resembles the derivative of input signal "X" (FIG. 4) plus quantization noise. The differentiation significantly attenuates the component of the input signal "X" to $f_2$ at the input signal frequency used since the input signal frequency is substantially lower than the sample frequency in the over-sampling scheme.

TABLE 4.1

Surface Fit Equation Terms and Coefficients Using Linear Search Sampling

| Term | Coefficient |
| --- | --- |
| $a_{11}^2$ | 7.320 |
| $a_{12}^2$ | 5.740 |
| $a_{13}^2$ | 10.050 |
| $a_{15}^2$ | 0.004 |
| $a_{16}^2$ | 0.004 |
| $a_{11}a_{13}$ | −12.760 |
| $a_{11}a_{14}$ | 0.090 |
| $a_{11}a_{16}$ | −0.210 |
| $a_{12}a_{13}$ | 0.030 |
| $a_{12}a_{15}$ | −0.010 |
| $a_{12}a_{17}$ | 0.120 |
| $a_{13}a_{14}$ | −0.060 |
| $a_{13}a_{16}$ | 0.170 |
| $a_{16}a_{17}$ | 0.003 |

The SDR prediction equation was applied to the eight modulator instances associated with the design of experiment (DOE). The non-linearity coefficients extracted from SPICE™ circuit simulations of the non-linear integrators described above were used in the difference equation sigma-delta simulator and the SDR obtained. Table 4.2 compares the SDR from simulation and that predicted by the surface equation.

TABLE 4.2

Simulated and Predicted SDR from Data Generated Using Linear Search Sampling

| Case | Simulated SDR | Predicted SDR |
| --- | --- | --- |
| 1 | 110.2 dB | 94.7 dB |
| 2 | 97.7 | 97.6 |
| 3 | 94.6 | 93.4 |
| 4 | 108.0 | 99.4 |
| 5 | 96.7 | 95.6 |
| 6 | 101.8 | 98.5 |
| 7 | 96.2 | 95.4 |
| 8 | 97.0 | 96.9 |

TABLE 4.2-continued

Simulated and Predicted SDR from Data Generated Using Linear Search Sampling

There was substantial discrepancy between the simulated SDR and that predicted by the equation. The discrepancies appeared larger when the SDR was higher than 96 to 97 dB where the fit was performed. To understand the relationship between the modulator response and the prediction equation, a comparison based upon randomly chosen modulator instances was performed. Coefficients for the surface equation illustrated in Table 4.1 was tested by randomly generating modulator instances using the difference equation sigma-delta simulator. Vectors in the seven dimension space were randomly chosen and the simulator run to determine the SDR of the resulting modulator instance. Based on the range of non-linearity coefficients from SPICE™ simulations of first integrator 71, the coefficients of $f_1$ were selected from a uniform distribution ranging from $-10^{-5}$ to $+10^{-5}$, and the coefficients of $f_2$ were selected from a uniform distribution ranging from $-10^{-4}$ to $+10^{-4}$. The resulting 2000 modulator instance SDRs ranged from 87.2 dB to 110.7 dB. The SDR histogram of the test set is nearly centered around an SDR of 96.5 dB, and therefore a robust test of the prediction equation near the region of the fit. The surface equation was used to predict the SDR from the non-linearity coefficient values of the test set.

The relationship between the predicted and simulated SDR becomes highly non-linear as the SDR moves out of the 96+/−0.5 dB region where the fit was performed. When the SDR is significantly higher or lower than 96.5 dB, the predictor underestimates the SDR, but does so in a monotonic and consistent fashion. The relationship is monotonic, and therefore the lack of prediction accuracy away from the fit region is inconsequential when the equation is used in design optimization procedures. Monotonicity allows a gradient based optimization approach to seek the desired performance. From 500 points in the region of the fit the RMS error in the prediction accuracy was determined to be 0.25 dB.

The feature which differentiates the modulator instance represented by the first row of Table 4.2 is that the magnitude of the coefficients of $f_2$ are larger than those of the other rows, with $a_{15}$ and $a_{17}$ equal to approximately $1.5 \times 10^{-4}$. The model capacitor has input non-linearity and integration non-linearity. The larger integration non-linearity of model capacitor integrator 71 represented by the larger coefficient magnitudes is due to the low bias, high capacitance per unit area, and high temperature simulation conditions. These conditions cause longer settling times for the integrator which in turn increase the integrator non-linearity.

The prediction equation postulated to be inaccurate for the case in row one of Table 4.2 because the sampling of the parameter space was inadequate, and an important part of the parameter space was under-sampled. The $a_{11}$ non-linearity coefficient associated with $f_1$ ranges from $-4 \times 10^{-6}$ to $+4 \times 10^{-6}$; the range for $a_{12}$ and $a_{13}$ are similar. Because the terms associated with $f_1$ dominate the distortion and the random vector direction used in linear search sampling used equal weights on all parameters, samples where the non-linearities of $f_2$ impact the distortion were not adequately sampled. In order to remedy the inadequate sampling, other sampling approaches were investigated.

In an effort to force the sampling algorithm to allow the $f_2$ coefficients to impact the SDR, the algorithm was modified by randomly weighting the $f_1$ and $f_2$ functions before the linear search algorithm was employed. The improved sampling algorithm allowed the $f_2$ coefficients to be as large as $6 \times 10^{-4}$, substantially larger than in the original sampling scheme.

The samples obtained with the random weighting sampling approach were used with the genetic algorithm surface fit and the resulting terms and coefficients of the fit are shown in Table 4.3. The terms in Table 4.3 are similar to those of the original solution, but 21 terms were found significant compared to 14 of the original solution. The convergence to the best fit is significantly slower for this sampling method converging in 800 generations with a final correlation coefficient of 0.99, significantly higher than the original solution. The slower convergence to a higher value of "R" is due to the presence of fine surface features in the data, which require more terms in the fit.

The new model was tested by fitting it to the characteristics of eight sets of the three integrators used in the SOFOC2 modulator 70 (FIG. 4). These sets of integrators comprise a screening design of experiment (DOE) with seven factors, which is a first step in design verification. Table 3.1 shows the Placket-Burman DOE used. The factors were capacitance per unit area, opamp bias current, weak (W) and strong (S) NMOS and PMOS SPICE™ models, supply voltage, temperature, and single ended (SE) or fully differential (FD) input signal. The fit of the model to these integrator instances is a robust test for the model since the three integrators are different in design, and they are simulated over several process, operational, and environmental variations.

For each of the three integrators 71, 72, and 73, (FIG. 4) and each of the conditions shown in Table 3.1, the integrator output "W" was determined for various combinations of input voltage, initial output voltage, and for both positive and negative reference inputs using SPICE™ simulation. The result was data which characterizes the integrator linearity as a function of input signal voltage, voltage reference polarity, and integrator initial condition. The model illustrated in FIG. 6 with $f_1$ and $f_2$ distorting functions given below in equations (11) and (12), was fit to the simulation data in a least-squares sense. More generally, FIG. 6 is a non-linear integrator model with distorting functions $f_1$ and $f_2$. The output voltage $v_{out}$ is a function of the input voltage $v_{in}$, and the reference voltage $v_{ref}$, as illustrated in the following equation $v_{out} = av_{in} - av_{out} + v_{out}z^{-1}$. This equation is further expanded in equation (38) which is further described below.

There are three coefficients associated with the input sampling non-linearity $f_1$. The linear term is omitted from the input sampling distortion function since it has the same effect as scaling the reference which has little impact on distortion and quantization noise. There are four coefficients associated with the $f_2$ integration distorting function. The result of the fits was the coefficients of $f_1$ and $f_2$ for each integrator, for each case in Table 3.1. The aggregate root mean squared (RMS) error in the fit for all 24 cases was less than 10 mV. The error in the integrator output voltage due to the model is reasonably small compared to the limited accuracy of the circuit simulator and semiconductor device models used in simulation. Errors SPICE™ simulation of switched capacitor circuits has been found to in the millivolt range.

TABLE 3.1

Placket-Burman Design of Experiments

| Case | C/A (fF/um²) | Ibias (uA) | NMOS Models | PMOS Models | Supply Voltage (Volts) | Temp (° C.) | Input |
|---|---|---|---|---|---|---|---|
| 1 | 1.2 | 75 | Weak | Strong | 4.5 | 85 | Fully Differential (FD) |
| 2 | 1.2 | 125 | W | W | 5.5 | −40 | FD |
| 3 | 1.2 | 125 | S | W | 4.5 | 85 | Single Ended (SE) |
| 4 | 0.8 | 125 | S | S | 4.5 | −40 | FD |
| 5 | 1.2 | 75 | S | S | 5.5 | −40 | SE |
| 6 | 0.8 | 125 | W | S | 5.5 | 85 | SE |
| 7 | 0.8 | 75 | S | W | 5.5 | 85 | FD |
| 8 | 0.8 | 75 | W | W | 4.5 | −40 | SE |

The model obtained the best fit to integrator simulation data when fourth-order Chebychev polynomials were used for functions $f_1$ and $f_2$.

The $f_1$ function played a more significant role in modeling the non-linearities in the cases where a single ended input was used (cases 3, 5, 6, and 8) in Table 3.1. The result is expected since $f_1$ is related to non-linearities due to the input sampling process which are greater for single ended input signals. Single ended input configurations have higher even ordered harmonics compared to fully differential inputs. For switched capacitor integrators the source of the even ordered harmonic distortion is incomplete sample settling, common-mode settling induced error, and input sampling capacitor non-linearity. Table 3.2 shows the $f_1$ coefficients for the first integrator for the eight DOE cases from Table 3.1. Consistent with the presence of higher even ordered harmonics, the single ended input cases have higher values of $a_1$ and $a_3$, which are the quadratic and fourth power terms of the $f_1$ Chebychev polynomial distorting function of the non-linear integrator model of equation (35). This information regarding the nature of the non-linearity is valuable in guiding design modifications in meeting the design goals.

TABLE 3.2

Non-linearity Coefficients of $f_1$ for First Integrator Instances from DOE of Table 3.1.

| Case | $a_1$ | $a_2$ | $a_3$ |
|---|---|---|---|
| 1 | −1.3e-8 | −9.6e-7 | −1.1e-8 |
| 2 | −6.6e-8 | 2.7e-6 | 3.3e-9 |
| 3 | −3.0e-6 | 2.5e-6 | −5.9e-7 |
| 4 | −4.4e-8 | −4.4e-7 | 1.6e-8 |
| 5 | −3.4e-6 | −1.1e-6 | −1.2e-6 |
| 6 | −1.4e-6 | 9.2e-7 | −5.0e-7 |
| 7 | 2.2e-8 | −3.9e-6 | −2.3e-9 |
| 8 | −1.2e-6 | 6.6e-7 | 1.3e-6 |

TABLE 3.3

Non-linearity Coefficients of $f_2$ for First Integrator Instances from DOE of Table 3.1.

| Case | $a_4$ | $a_5$ | $a_6$ | $a_7$ |
|---|---|---|---|---|
| 1 | 4.1e-5 | 1.5e-4 | −2.8e-5 | 1.5e-4 |
| 2 | −6.9e-6 | −1.2e-5 | −2.6e-6 | −1.3e-5 |
| 3 | −4.2e-5 | −1.4e-5 | −1.5e-5 | 1.8e-5 |
| 4 | −1.4e-6 | 4.5e-5 | −5.0e-7 | 2.1e-6 |
| 5 | −3.2e-3 | 5.8e-5 | −1e-5 | 2.0e-5 |
| 6 | 1.6e-5 | 4.8e-5 | 7.8e-6 | 1.7e-5 |

TABLE 3.3-continued

Non-linearity Coefficients of $f_2$ for First Integrator Instances from DOE of Table 3.1.

| Case | $a_4$ | $a_5$ | $a_6$ | $a_7$ |
|---|---|---|---|---|
| 7 | −2.5e-5 | 6.6e-5 | −1.1e-5 | 8.4e-5 |
| 8 | −4.3e-5 | 3.1e-6 | −1.4e-5 | 8.3e-6 |

Table 3.3 shows the non-linearity coefficients for $f_2$ of the first integrator for the eight cases of DOE from Table 3.1. The coefficients represent non-linearity due to integration errors. Most errors associated with integration are expected to be due to incomplete settling which will be exacerbated by high temperature, low bias current, and high capacitance per unit area. Case one represents the worst case for temperature, bias current, and capacitance per unit area and shows the highest non-linearity, with $a_5$ and $a_7$ equaling $1.5 \times 10^{-4}$. Case four represents the best case for temperature, bias current, and capacitance per unit area and shows the lowest non-linearity.

From Tables 3.2 and 3.3 it is observed that the coefficients extracted from the integrator designs capture non-linearities which correlate with the operational and environmental conditions simulated. The non-linear integrator model introduces negligible errors compared to the limited accuracy of SPICE™ transistor models, and the extracted coefficients contain information useful in integrator optimization.

The fit was tested on the extracted integrator coefficients of the DOE of Table 3.1, and the results are illustrated in Table 4.4. The discrepancy of the first row was eliminated with the improved sampling. It is noted however, that the range of non-linearity coefficients of $a_{15}$ is $+/-5 \times 10^{-5}$, still smaller than the $+/-1.5 \times 10^{-4}$ observed in the extracted value of $a_{15}$ from case one of the DOE of Table 3.1.

The fit was tested with the randomly selected integrator test set described in the previous section. If the predictor is to be used to make decisions in circuit optimization, then the error in prediction is important to factor into the decision process. The predictor functions may be used as a classifier. The first and third quadrant formed by the cross-hairs contain correct classifications, while those in quadrants two and four are misclassifications. The RMS error in the misclassifications is approximately 0.1 dB. Errors of this magnitude are acceptable for prediction of SDR during sigma-delta circuit optimization, and virtually all modulator instances represented by the test set will have SDR predicted to within 0.45 dB.

TABLE 4.3

Surface Fit Equation Terms and Coefficients Using Improved Linear Search Sampling

| Term | Coefficient |
|---|---|
| $a_{11}$ | −0.029 |
| $a_{12}$ | −0.006 |
| $a_{13}$ | 0.050 |
| $a_{15}$ | 0.009 |
| $a_{17}$ | −0.004 |
| $a_{11}^2$ | 7.300 |
| $a_{12}^2$ | 5.758 |
| $a_{13}^2$ | 9.972 |
| $a_{14}^2$ | 0.004 |
| $a_{16}^2$ | 0.002 |
| $a_{17}^2$ | 0.001 |
| $a_{11}a_{12}$ | −0.003 |
| $a_{11}a_{13}$ | −12.701 |

TABLE 4.3-continued

Surface Fit Equation Terms and Coefficients Using Improved Linear Search Sampling

| Term | Coefficient |
|---|---|
| $a_{11}a_{14}$ | 0.098 |
| $a_{11}a_{16}$ | −0.249 |
| $a_{12}a_{15}$ | −0.025 |
| $a_{12}a_{17}$ | 0.110 |
| $a_{13}a_{14}$ | −0.091 |
| $a_{13}a_{16}$ | 0.201 |
| $a_{13}a_{17}$ | 0.001 |
| $a_{14}a_{16}$ | −0.002 |

TABLE 4.4

Simulated and Predicted SDR from Data Generated Using Improved Linear Search Sampling

| Case | Simulated SDR | Predicted SDR |
|---|---|---|
| 1 | 110.2 dB | 100.0 dB |
| 2 | 97.7 | 97.6 |
| 3 | 96.4 | 93.7 |
| 4 | 108.0 | 99.8 |
| 5 | 96.7 | 96.7 |
| 6 | 101.8 | 99.1 |
| 7 | 96.2 | 96.0 |
| 8 | 97.0 | 97.0 |

An improved sampling method is the Gibbs Data Sampling method. Gibbs sampling was applied to the problem of sampling the parameter space of $f_1$ and $f_2$. The Gibbs sampler implemented by an enhanced version of MCSIM Markov Chain Monte Carlo Simulator) requires initial prior distributions for the parameters to be sampled, and a desired response distribution for use as a likelihood function. The initial priors for all seven parameters of $f_1$ and $f_2$ were set to a uniform distribution from $-10^{-4}$ to $10^{-4}$ since this approximately spans the range of the largest non-linearity coefficients seen in the SPICE™ simulations of the integrators of the DOE in Table 3.1. The desired distribution was set to a normal distribution with mean of 96.5 dB and a standard deviation of 0.5 dB.

Ten independent executions of 230 samples were run using the Gibbs sampler with different initial conditions on the seven parameters $a_{11}$ through $a_{17}$. As per the multiple sequence method of Geman and Geman, a number of samples were discarded at the beginning of each run. The number of runs discarded was determined by examining the likelihood that the response sample came from the desired normal distribution. The log-likelihood of the posterior distribution of the response was calculated for each sample generated by MCSIM for each of the ten runs.

The convergence of the ten runs to the desired posterior distribution was tested using the method of Geman and Geman. The variance in the mean of the response from run to run was compared to the mean of the run to run response variance. The variance of the means was $4.99 \times 10^{-3}$ and the mean of the variances was 0.253, which show that the runs converged to the same desired distribution. The data are normally distributed with mean 96.44 dB and standard deviation of 0.51 dB, which are very close to the desired mean and standard deviation.

The Gibbs sampler alters the distributions of the parameters sampled in order to achieve the desired response distribution. The initial prior distribution was uniformly distributed from $-10^{-4}$ to $10^{-4}$ while the Gibbs sampler automatically narrowed the distribution for this parameter to the range of $-4 \times 10^{-6}$ to $4 \times 10^{-6}$. The Gibbs sampler significantly narrowed the distribution of the important parameters.

The distribution of samples obtained from the Gibbs sampler was truncated to the range 96.5+/−0.5 dB to more evenly represent the desired response region in the surface fit, and the genetic algorithm surface fit applied to the 1100 remaining samples. "R" converges to the final value of 0.98 in 600 generations. The resulting surface is represented by the terms and coefficients in Table 4.5. The resulting prediction equation is similar to those of the previous sections resulting from linear search sampling and improved linear search sampling.

TABLE 4.5

Surface Fit Equation Terms and Coefficients Using Gibbs Sampling

| Term | Coefficient |
|---|---|
| $a_{13}$ | 0.080 |
| $a_{11}^2$ | 6.90 |
| $a_{12}^2$ | 5.550 |
| $a_{13}^2$ | 9.726 |
| $a_{14}^2$ | 0.001 |
| $a_{16}^2$ | 0.002 |
| $a_{17}^2$ | 0.001 |
| $a_{11}a_{13}$ | −12.220 |
| $a_{11}a_{14}$ | 0.096 |
| $a_{11}a_{16}$ | −0.235 |
| $a_{12}a_{15}$ | −0.032 |
| $a_{12}a_{17}$ | 0.109 |
| $a_{13}a_{14}$ | −0.086 |
| $a_{13}a_{16}$ | 0.203 |
| $a_{13}a_{17}$ | 0.001 |
| $a_{14}a_{16}$ | −0.002 |

The fit was tested on the extracted integrator coefficients of the DOE of Table 3.1, and the results are presented in Table 4.6. The prediction equation using the Gibbs sampled data generated results as good as the ad-hoc sampling method of the previous section. As with the previous ad-hoc improved linear sampling method, the RMS error in the misclassifications is low, at 0.07 dB, in the region of the fit, allowing virtually all modulator instances represented by the test set to have SDR predicted to within 0.31 dB.

TABLE 4.6

Simulated and Predicted SDR from Data Generated Using Gibbs Sampling

| Case | Simulated SDR | Predicted SDR |
|---|---|---|
| 1 | 110.2 dB | 100.1 dB |
| 2 | 97.7 | 98.0 |
| 3 | 96.4 | 94.2 |
| 4 | 108.0 | 100.2 |
| 5 | 96.7 | 97.2 |
| 6 | 101.8 | 99.6 |
| 7 | 96.2 | 96.3 |
| 8 | 97.0 | 97.4 |

Quadratic polynomials for SDR prediction were obtained using genetic algorithm surface fit 80 (FIG. 5) for three different parameter space sampling methods. The prediction equation obtained using a straight-forward linear search method underestimated a modulator instance from the integrator DOE.

An improved sampling method was developed and tested which randomly weights the parameters due to input sampling non-linearity ($a_{11}$, $a_{12}$, $a_{13}$) and non-linearity due to integration ($a_{14}$, $a_{15}$, $a_{16}$, $a_{17}$). The improved method yielded accurate prediction of the modulator instances in the DOE and achieved a prediction accuracy of +/−0.45 dB near the fit region. A disadvantage of this method is the lack of control on the range of non-linearity coefficients sampled. Gibbs sampling was pursued to overcome this shortcoming.

A Gibbs Data sampling method was applied to the problem of sampling the parameter space, and the resulting prediction equation was similar to that obtained using the sampling method described above. The Gibbs sampling method yielded accurate prediction of the modulator instances in the DOE and achieved a prediction accuracy of +/−0.31 dB near the fit region. The accuracy of the resulting prediction equation is sufficient to be useful in SDR optimization.

In this section the prediction equation result of Signal-to-Distortion response section is verified by determining the theoretical relationship between the input sampling related non-linearities and SDR. The SDR degradation due to coefficients $a_{11}$, $a_{12}$, and $a_{13}$ is plotted along with the SDR obtained through difference equation sigma-delta simulation, and these are compared to SDR predicted by the prediction polynomial obtained from the genetic algorithm surface fit obtained using Gibbs sampling.

Harmonic distortion results when a sinusoidal signal is passed through a polynomial function of order two or higher. The theoretical SDR can be determined analytically for the non-linearities associated with input sampling given a polynomial function. This analysis verifies the numeric values of the prediction equation coefficients and shows that the equation has physical meaning.

When a sinusoidal signal of amplitude "A" and frequency w is distorted by the quadratic term of the polynomial function, the resulting distortion signal is g(t) below.

$$g(t) = 2a_{11}A^2 \sin^2\omega t - 1 \quad (14)$$

Expansion and the use of a trigonometric identity transforms (14) into the following equation, $$g(t) = a_{11}A^2 - a_{11}A^2 \cos 2\omega t - 1 \quad (15)$$

from which the SDR can be calculated for the second harmonic as shown below.

$$SDR_2 = \frac{A}{|a_{11}|A^2} = \frac{1}{|a_{11}|A} \quad (16)$$

Equation (17) and (18) are derived in similar fashion and describe the SDR resulting from the cubic and fourth-order terms of the polynomial function.

$$SDR_3 = \frac{A}{|a_{12}|A^3} = \frac{1}{|a_{12}|A^2} \quad (17)$$

$$SDR_4 = \frac{1}{\sqrt{a_{13}^2 A^6 + [4a_{13}(A - A^3)]^2}} \quad (18)$$

Equations (16), (17), and (18) are expressions for the SDR associated with the non-linear terms of the input sample distorting function $f_1$ as a function of input signal amplitude and non-linearity coefficient magnitude. The relationships described by these equations were compared to the SDR resulting from numerical sigma-delta simulations with various non-linearity coefficients, and to the SDR from the prediction equation. The theoretical and simulated SDR versus $a_{11}$ are in agreement, except for when $a_{11}$ is zero, where FFT noise floors limits SDR to lower than theory. The SDR predicted by the polynomial equation from the genetic algorithm surface fit has a much different response to $a_{11}$, and is tangent to the theoretical and simulated SDR curves in the 96.5 dB region where the fit was performed. As SDR becomes greater or less than 96.5 dB, the predicted SDR and that from theory and simulation diverge. The reason the prediction equation is only accurate near where the fit was performed is that the curves diverge away from this region.

The SDR prediction equations are highly non-linear and do not predict SDR accurately away from the region of the fit. The SDR prediction equations yield a monotonic relationship when compared to simulated SDR. The lack of accuracy away from the region of the fit is inconsequential in circuit optimization, since monotonicity allows the determination of performance gradients useful in improving the circuit design.

While the prediction curves are only accurate near where the fit was performed, the resulting relationships are monotonic and therefore useful in optimization of sigma-delta circuits to achieve a desired SDR.

Signal-To-Noise Response

The sampling and surface fit methods used in determining the SDR prediction equations of the signal-to-distortion section were applied to determining the SNR prediction equation. The approach to determining the SNR equation was similar to that used in the signal-to-distortion section in that the difference equation sigma-delta simulator was used to generate random modulator instances on an equi-SNR surface to which a surface equation was fit. The sampling schemes were modified slightly because of fundamental differences between operating conditions best used to observe SDR and SNR degradation.

SNR depends on shaping the quantization noise by the modulator. The spectral shaping is input signal amplitude independent in the absence of idle channel tones, which the SOFOC2 modulator 70 (FIG. 4) does not exhibit because the feedback from the first comparator 74 is uncorrelated with the input signal "X" due to the preceding two integrators 72 and 73. In order to determine the impact of integrator non-linearity on quantization noise shaping and not have distortion related aliased tones corrupt the spectrum, a small input sine-wave with 10 mV amplitude is used as input to the modulator during difference equation simulation. The resulting modulator dynamic range referenced to the maximum useable input 3 dB below the voltage reference level is referred to in this specification as SNR. The desired SNR is 99 dB for 16-bit dynamic range, allowing for contribution of thermal noise from the opamps and switches in the circuit.

From the analysis of the SOFOC2 modulator 70 with non-linear integrators, integrator non-linearities from integrators 71, 72, and 73 are expected to impact quantization noise shaping. Furthermore, errors which are uncorrelated with the input signal "X" and introduced by any of the integrators can inject noise which is indistinguishable from quantization noise. In determining the SNR prediction equation, the non-linearities of integrators 71, 72, and 73 are considered.

To minimize the complexity of the surface fit, the number of integrator non-linearity coefficients was reduced by determining which coefficients have significant impact on SNR. Modulator simulations were performed using a difference equation sigma-delta simulator by varying the non-linearity coefficients individually and recording SNR. These simulations demonstrated that the SNR result is sensitive to the number of modulator output samples, and also the length of the FFT used in calculating SNR. The reason for this dependence is that the variance in the integrated quantization noise calculated for a larger number of FFT bins is smaller than when fewer FFT bins are used in the calculation. To minimize this effect, the number of modulator output samples was increased by a factor of 16 so that 8192 bins represented the base-band as opposed to 512 points in initial simulations.

Figure 7:
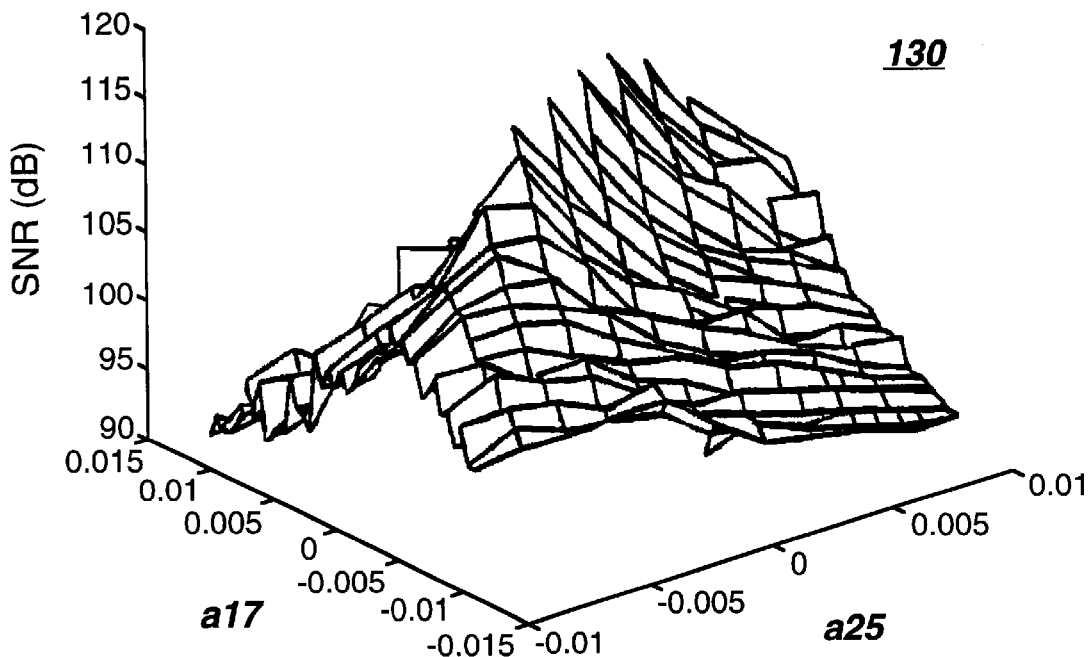
FIG. 7 is a two dimensional plot of a SNR for non-linearities for $a_{17}$ and $a_{25}$ using 512 points in base-band.
Figure 8:
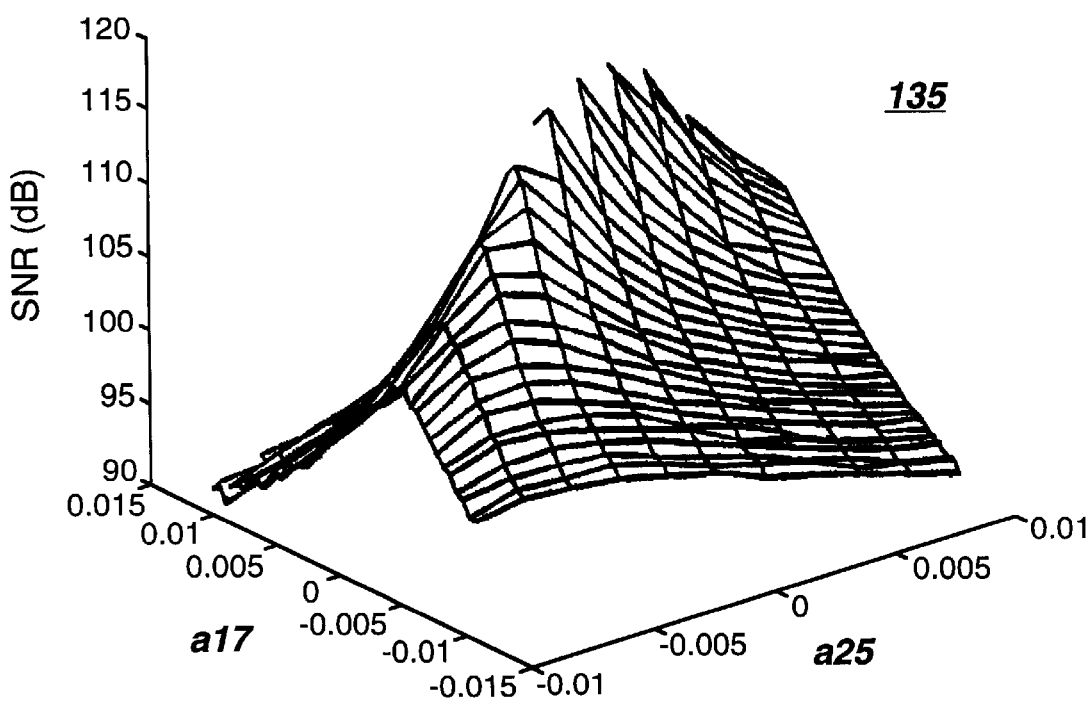
FIG. 8 is a two dimensional plot of a SNR for non-linearities for $a_{17}$ and $a_{25}$ using 8192 points in base-band.

FIG. 7 shows a SNR simulation as a function of non-linearity coefficients $a_{17}$ and $a_{25}$ with 512 FFT points in the base-band. The resulting SNR surface 130 in this two parameter space has a rough texture. The accuracy of a prediction equation fit to surface 130 could be limited by the roughness of the surface. FIG. 8 shows a revised surface 135 by varying the same two parameters as in FIG. 7, but with 8,192 FFT points representing the base-band. The longer FFT is used to minimize prediction accuracy limitations from surface 130 roughness shown in FIG. 7.

The increase in the number of modulator output samples increased the modulator simulation time significantly. To decrease the simulation time to a reasonable level a $sinc^4$ decimation filter was implemented in software, and the output of the decimation filter used in the FFT instead of the raw modulator output "Y". The resulting simulation time was on the order of five seconds on a SPARC-20 workstation. The smoothing of the surface could also be accomplished using a digital filter of high dimension, but increasing the length of the FFT provides sufficient surface smoothness, and does not require the design of a high-dimension digital filter.

The non-linearities for $f_1$ and $f_2$ of each of the three integrators were varied individually to determine which have the highest impact on SNR. The coefficients that have significant impact on SNR were determined to be $a_{15}$, $a_{16}$, $a_{17}$, $a_{21}$, $a_{22}$, $a_{23}$, $a_{25}$, $a_{27}$, and $a_{32}$. The remainder of The SNR section is concerned with determining the impact that these non-linearities have on SNR.

The coefficients that degrade SNR most are associated with quadratic and fourth power terms of the distorting functions $f_1$ and $f_2$ of integrators 71 and 72 (FIG. 4). These coefficients always cause an increase or decrease in the integrator output, depending on the sign of the coefficient, and this is similar to the effect of a leaky integrator which is known to increase quantization noise. It is also noted that the magnitude of non-linearity coefficients which cause degradation of SNR below the 99 dB SNR goal are much larger than those which degrade the SDR to below the 96 dB SDR goal, on the order of $10^{-2}$ as compared to $10^{-4}$ for SDR.

The nine non-linearity coefficients identified above were implemented in the linear search sampling method, the modified linear search sampling method described in the Signal-to-distortion section, and the Gibbs data sampling method. Two thousand modulator instances were generated using each sampling method, and genetic algorithm 80 (FIG. 5) applied to determine the best SNR prediction equation with 40 terms or less. The range of SNR used in the surface fit was 98 dB to 102 dB to allow for the uncertainty in SNR calculation due to the finite length FFT. The sample distribution resulting from Gibbs sampling was truncated to samples with SNR between 98 and 102 dB as was done in the SDR surface fit of The SDR section. The same form was used for the SNR prediction equation as for SDR equation (13) and is shown below.

$$SNR = 794{,}328 - f(a_{15}, a_{16}, a_{17}, a_{21}, a_{22}, a_{23}, a_{25}, a_{27}, a_{32}) + B \quad (19)$$

Genetic algorithm 80 was applied to the data generated using linear search sampling, improved linear search sampling, and Gibbs sampling. The non-linearity coefficients and associated numerical values for the prediction equation using the three sampling methods are summarized in Table 5.1. The 22 shared coefficients of the three solutions have similar numerical values which indicates that they arrive at fundamentally the same solution. The non-linearities with the highest sensitivity are $a_{15}$, $a_{21}$, $a_{23}$, $a_{25}$, and $a_{27}$, with $a_{23}$ having the highest sensitivity.

There are significant interactions among non-linearites. Many of these interactions are due to the presence of a squared term in the quadratic and fourth order terms of the Chebychev polynomial used in the non-linear integrator 70 (FIG. 4). In addition, interactions result from interplay of non-linearities of the different integrators in altering the noise transfer function of the modulator.

TABLE 5.1

Terms and Coefficients of SNR Prediction Equations for Three Sampling Methods.

| Term | Coefficient from Linear Search Sampling | Coefficient from Improved Linear Search Sampling | Coefficient from Gibbs Sampling |
|---|---|---|---|
| $a_{15}$ | −0.193 | −0.320 | −0.327 |
| $a_{16}$ | — | — | −0.046 |
| $a_{17}$ | 0.255 | 0.155 | 0.195 |
| $a_{21}$ | 0.014 | — | — |
| $a_{22}$ | 1.856 | 2.060 | 1.839 |
| $a_{23}$ | 0.030 | — | — |
| $a_{25}$ | — | 0.001 | 0.102 |
| $a_{27}$ | — | 0.010 | −0.006 |
| $a_{32}$ | −0.135 | — | 0.033 |
| $a_{15}^2$ | 1.570 | 1.478 | 1.413 |
| $a_{16}^2$ | — | 0.058 | — |
| $a_{17}^2$ | 0.792 | 0.769 | 0.884 |
| $a_{21}^2$ | 1.316 | 1.277 | 1.380 |
| $a_{22}^2$ | 0.187 | 0.112 | 0.366 |
| $a_{23}^2$ | 16.684 | 16.609 | 16.830 |
| $a_{25}^2$ | 1.589 | 1.462 | 1.606 |
| $a_{27}^2$ | 1.417 | 1.379 | 1.506 |
| $a_{32}^2$ | 0.046 | 0.023 | — |
| $a_{15}a_{17}$ | −2.230 | −2.044 | −1.969 |
| $a_{15}a_{21}$ | — | −0.001 | — |
| $a_{15}a_{22}$ | −0.439 | −0.494 | −0.358 |
| $a_{15}a_{23}$ | — | 0.004 | — |
| $a_{15}a_{25}$ | 2.300 | 2.186 | 1.902 |
| $a_{15}a_{27}$ | −2.238 | −2.095 | −1.870 |
| $a_{15}a_{32}$ | −0.038 | — | — |
| $a_{16}a_{17}$ | — | — | 0.020 |
| $a_{16}a_{21}$ | −0.496 | −0.515 | −0.453 |
| $a_{16}a_{22}$ | — | — | −0.001 |
| $a_{16}a_{23}$ | 1.770 | 1.868 | 1.630 |
| $a_{18}a_{25}$ | 0.001 | — | — |
| $a_{16}a_{27}$ | — | 0.15 | −0.015 |
| $a_{16}a_{32}$ | — | 0.004 | — |
| $a_{17}a_{15}$ | — | −0.036 | −0.036 |
| $a_{17}a_{22}$ | 0.312 | 0.320 | 0.261 |
| $a_{17}a_{25}$ | −1.673 | −1.579 | −1.380 |
| $a_{17}a_{27}$ | 1.655 | 1.517 | 1.340 |
| $a_{17}a_{32}$ | −0.016 | — | — |
| $a_{21}a_{23}$ | −9.166 | −9.013 | −9.090 |
| $a_{21}a_{25}$ | — | −0.018 | — |
| $a_{21}a_{32}$ | −0.059 | 0.036 | — |
| $a_{21}a_{23}$ | — | — | 0.072 |
| $a_{22}a_{25}$ | −0.575 | −0.523 | −.490 |
| $a_{22}a_{27}$ | 0.551 | 0.536 | 0.452 |
| $a_{22}a_{32}$ | 0.073 | 0.067 | — |
| $a_{23}a_{25}$ | −0.116 | 0.013 | — |
| $a_{23}a_{27}$ | 0.074 | — | 0.009 |
| $a_{25}a_{27}$ | −2.976 | −2.885 | −2.76 |
| $a_{25}a_{27}$ | −0.020 | — | — |
| $a_{27}a_{32}$ | — | — | 0.015 |

Figure 9:
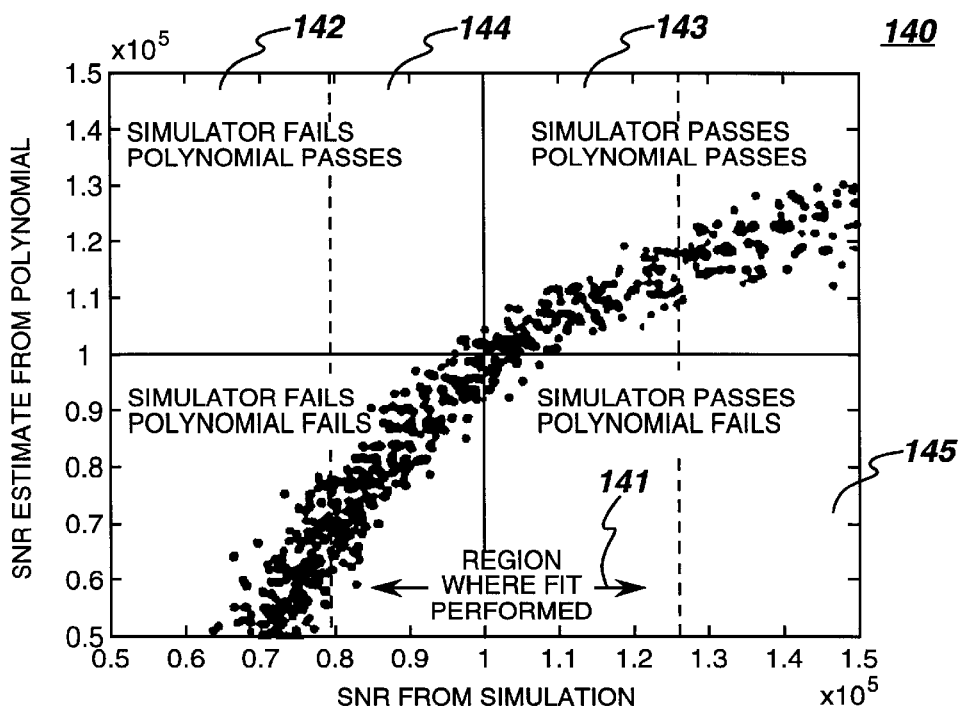
FIG. 9 is a plot of the simulated and predicted SNR using Linear Search Sampling.
Figure 10:
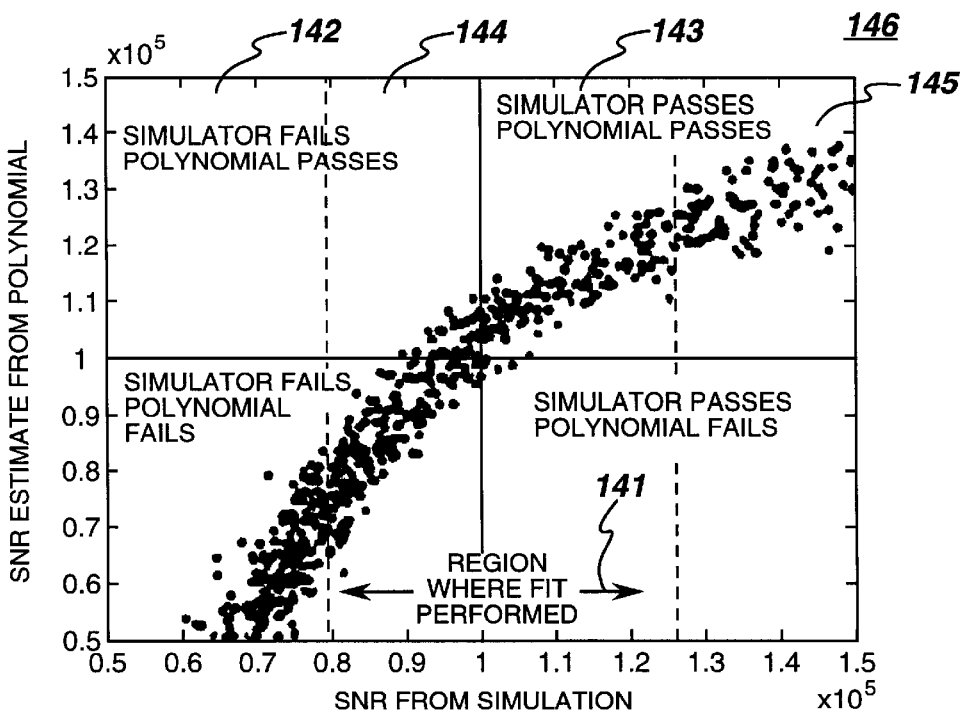
FIG. 10 is a plot of the simulated and predicted SNR using Improved Linear Search Sampling.
Figure 11:
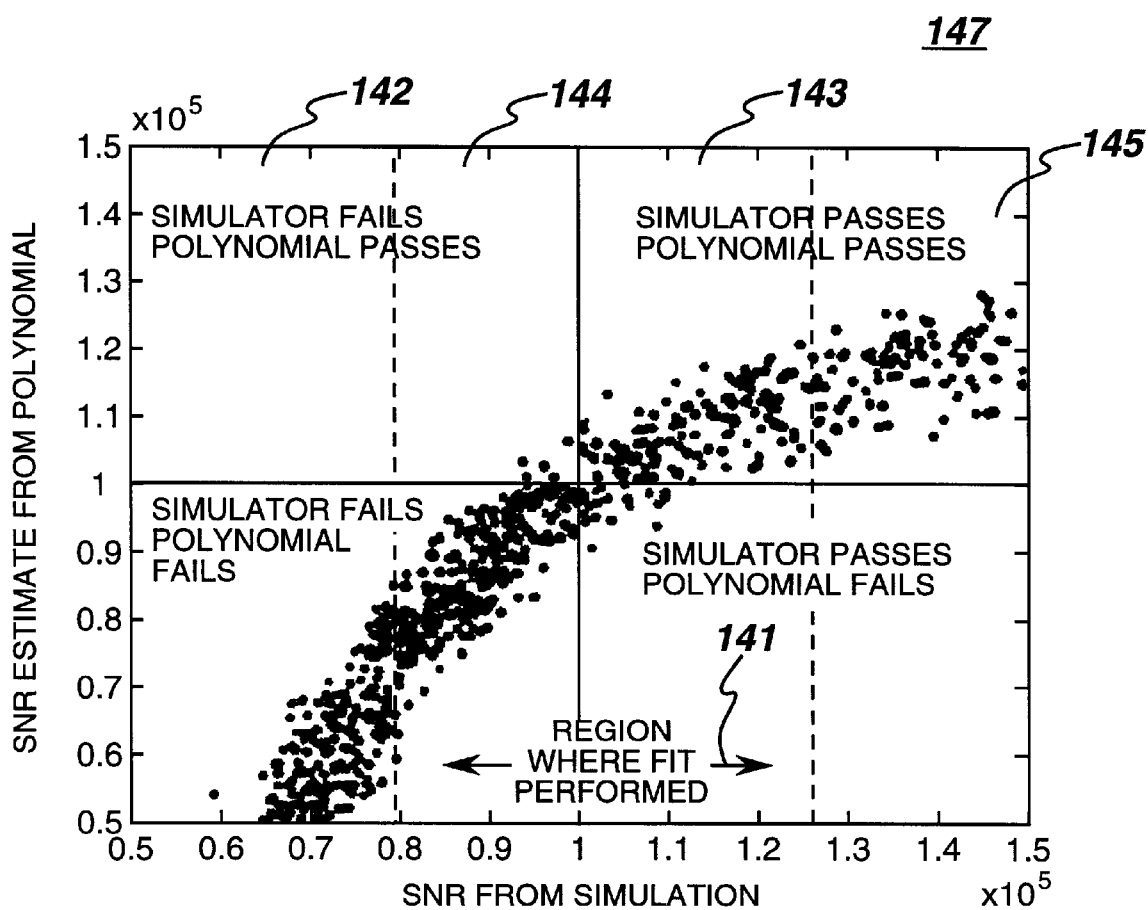
FIG. 11 is a plot of the simulated and predicted SNR using Gibbs Data Sampling.

To test the prediction equations of Table 5.1, a set of 2000 modulator instances were randomly generated using the sigma-delta difference equation simulator in a manner similar to that used in the SDR equation testing. The non-linearities were drawn from a uniform distribution with limits of $-5 \times 10^{-3}$ and $5 \times 10^{-3}$. The simulated versus predicted SNR 140, 146, and 147, also identified as the sufficiency surface, are shown for linear search, modified linear search, and Gibbs sampling in FIGS. 9, 10, and 11, respectively, with a region 141 of the fit delineated by dotted vertical lines. The cross-hairs at 100 dB represent lines of classification. Modulator instances in a first 142 and third 143 quadrants represent correct classification, while those in quadrants a second 144 and fourth 145 quadrant are misclassifications. The three methods have SNR prediction accuracy of approximately 2 dB near the region of the fit. Outside the region of the fit, the relationships are similarly non-linear, underestimating SNR. The Gibbs data sampling method is the only sampling means investigated which allows the user to specify the ranges to be used. The Gibbs sampler is therefore a very attractive sampling method in response surface determinations where there is some knowledge regarding the range of parameters.

The SNR prediction equations attained accuracy on the order of 2 dB, with the three sampling methods resulting in closely matched solutions, building confidence in the prediction equations. The resulting equations can predict the SNR of a modulator instance to within 2 dB without simulation as long as the SNR is near the range of 98 to 100 dB and the non-linearity coefficients extracted from SPICE™ simulations are in the range $-10^{-2}$ to $+10^{-2}$. For SNR's significantly outside the range of 98 to 102 dB the prediction equations underestimate SNR, and the relationship between the predicted and simulated SNR is monotonic, resulting in correct classification with respect to the SNR goal of 99 dB. These characteristics make the prediction equations of Table 5.1 useful in sigma-delta modulator circuit optimization.

The prediction equations of the three sampling methods of Table 5.1 allowed forty non-linearity coefficients maximum, "M"=40, in the genetic algorithm surface fit. It may be desirable to use fewer terms in order to simplify the SNR estimating polynomial. The impact of the maximum number of non-linearity coefficients on the prediction equation accuracy was investigated by running the surface fit with a maximum number of non-linearity coefficients "M" set to 10, 20, 30, and 40 terms, and examining the RMS error in SNR prediction in the region of the fit for the 2000 modulator test case of the previous section. The optimal number of non-linearity coefficients is approximately 30 terms for all three sampling methods. It is possible to trade prediction accuracy for polynomial complexity by using fewer non-linearity coefficients in the prediction polynomial. It is noted that the non-linearity coefficients are also referred to as polynomial coefficients in the specification.

The effect on prediction equation accuracy of a decreased number of samples in the data set used in the genetic algorithm surface fit was examined. It was determined that when the number of samples is reduced to 500 points, a decrease in accuracy of about 20% results. This reduction in accuracy increases the execution speed of the genetic algorithm fit substantially. The execution speed may be traded for prediction accuracy.

The effect of reduced resolution in the FFT used to calculate SNR was investigated. The surface roughness is effected by the length of the FFT used in determining SNR in the sigma-delta simulator. The length of the FFT was increased to 8192 in the base-band in order to provide a smooth surface as shown in FIG. 8. The increase in FFT length increased the time needed to generate the data used in the surface fit. The impact of the FFT length on prediction equation accuracy is of interest since decreased FFT length leads to faster data generation. The prediction equations were determined for data using the three sampling methods with 512 points in the base-band of the FFT. The impact on SNR prediction accuracy was not detectable. The SNR prediction error is not impacted significantly by effects from a finite length FFT. The major source of errors is thought to be due to higher order interactions which cannot be modeled by a quadratic equation.

The effects of using a n-dimensional polynomial surface fit was investigated by using the methods presented thus far in performing a cubic surface fit to the data used for the quadratic surface fits presented in this chapter. The genetic algorithm surface fit program was modified slightly to include third order interactions of the integrator non-linearities. The data which was generated using an improved linear search sampling method described below and used for the quadratic surface fit was used in determining the cubic surface fit.

It was found that because of the large number of possible combinations for a cubic surface in nine variables (220), convergence was significantly slower than for the quadratic surface case. In order to improve the convergence to a solution, a seed solution was planted in the initial solution set population which consisted of the quadratic surface solution. The convergence to the solution is significantly faster when a seed solution is used. The resulting solution from the cubic surface fit resulted in an improvement in the RMS estimation accuracy to approximately +/−0.4 dB, an improvement of 0.08 dB. The use of a higher order or n-dimensional surface fit marginally improves the SNR prediction accuracy.

A SOFOC2 third order sigma-delta modulator test circuit 160 (FIG. 13) was designed using conventional analysis methods for application of the SNR and SDR prediction equations described above. The circuit was designed such that the SDR and SNR can be measured over several operational conditions. The ability of the prediction equations to accurately estimate the measured SDR and SNR response of the modulator to changes in operational conditions shows the degree to which the SPICE™ models reflect actual device performance. The accuracy of the circuit simulations is important in using the methods developed in this specification since the accuracy of the integrator non-linearity coefficients used to predict SDR and SNR rely on circuit simulation accuracy.

Test Circuit Design

Figure 1:
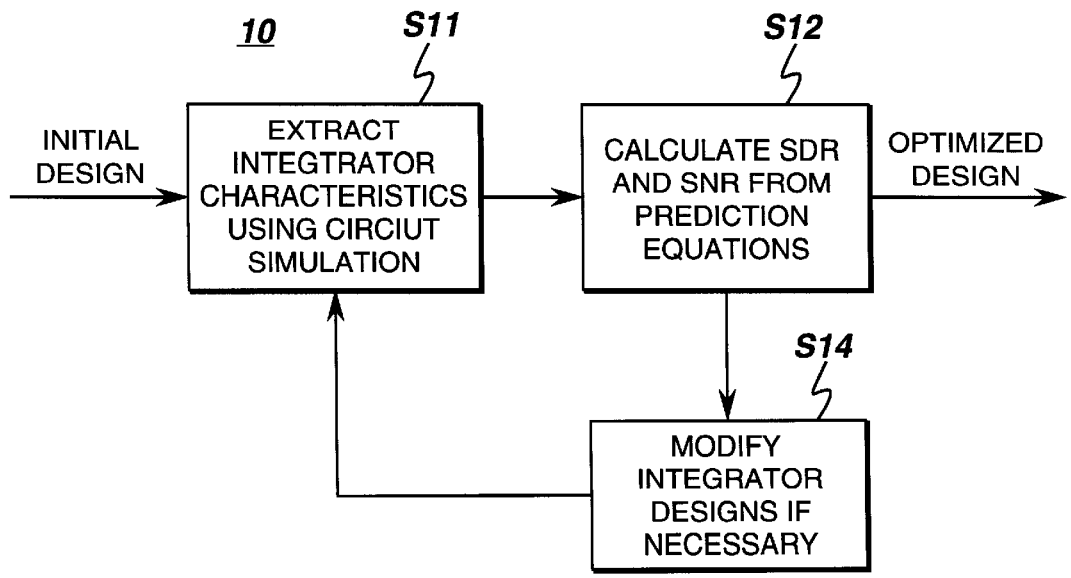
FIG. 1 is a block diagram of the testing method for the design process of the present invention.
Figure 15:
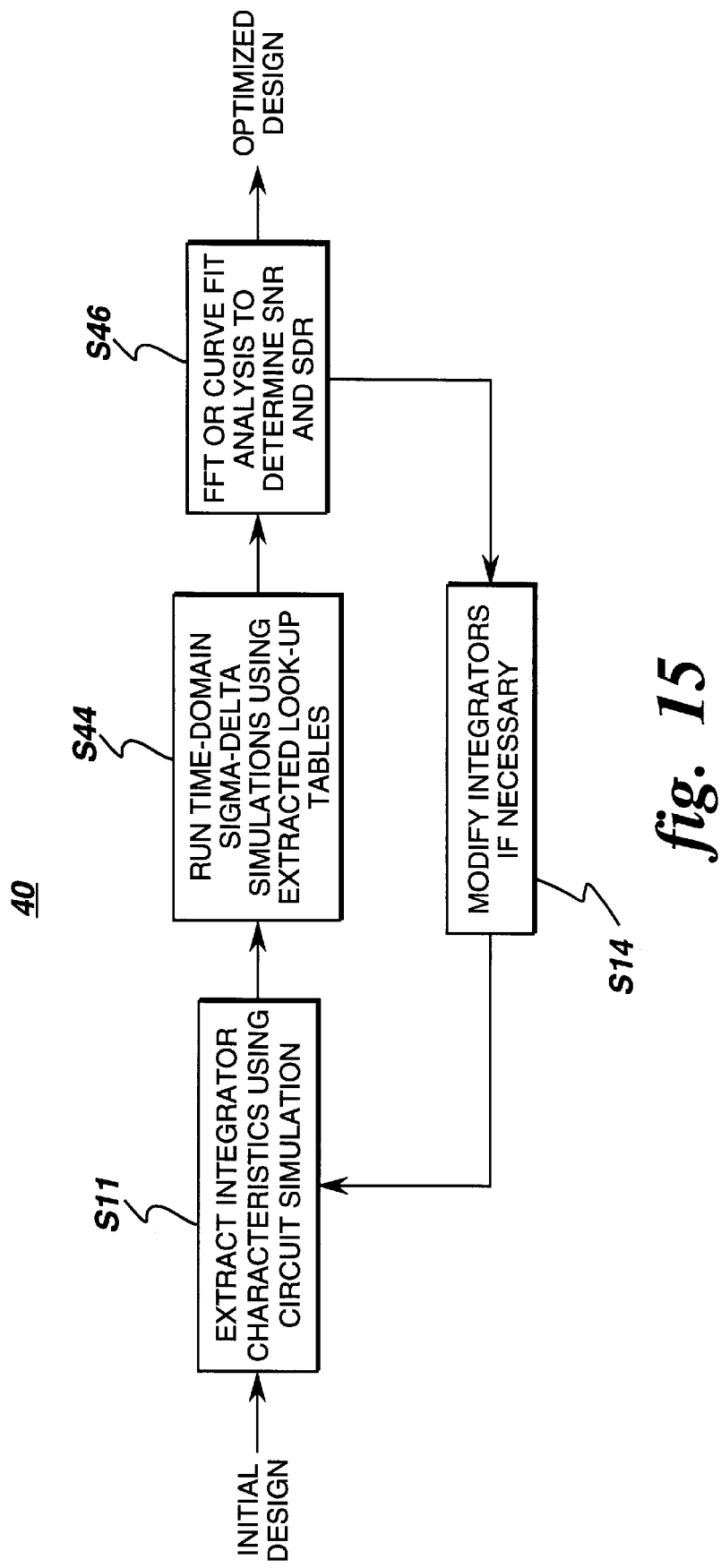
FIG. 15 is a flow diagram of the interactive sigma-delta optimization procedure using a look-up table simulation methodology.

FIG. 1 depicts a design process 10 for using the present invention to optimize the design of the delta-sigma modulator. Design process 10 comprises the following steps: begin with an initial design; extract integrator characteristics using circuit simulation S11; calculate SDR and SNR from prediction equations S12; and modify design if necessary and repeat steps S11 and S12, step S14. FIG. 15 depicts a more detailed approach 40 to the circuit design process 10 of FIG. 1, including the following additional steps: runt time-domain sigma-delta simulations using extracted look-up table S44; and conduct an FFT or curve fit analysis to determine SNR and SDR step S46.

The SDR and SNR performance is of interest in this specification. Other performance characteristics such as absolute gain and offset are of less interest since they can be eliminated through calibration.

The SOFOC2 modulator 60 is comprised of three switched capacitor integrators 61, 62, and 63, and two comparators 64. The integrators 61, 62, and 63, and comparators 64 (ADCs) are arranged as illustrated in FIG. 3.

Two types of integrators are used in SOFOC2 test circuit 60. The first integrator 61 uses double-rate sampling to minimize the contribution of flicker noise and offset of its opamp. The second 62 and third 63 integrators are more conventional switched capacitor integrators.

The signal and noise transfer functions are determined for the three integrators given the desired third order noise shaping with the scaling factors set by capacitor ratios. From the signal and noise transfer functions, a noise budget is determined and calculations used to determine initial sub-circuit designs. The subcircuits are optimized to meet the integrator requirements. The following sections present the analysis used to obtain subcircuit designs capable of meeting the SNR and SDR requirements.

The noise budget for the modulator can be obtained only after determining the noise contribution from each integrator. The spectral shaping of the integrators cause the thermal and flicker noise of the opamps to have a transfer function from the opamp inputs to integrator outputs which is different than from the integrator input to integrator output. This difference in transfer functions causes the noise to refer to the modulator input in a complex way. The signal and noise transfer functions of the three integrators are derived in this section.

Figure 13:
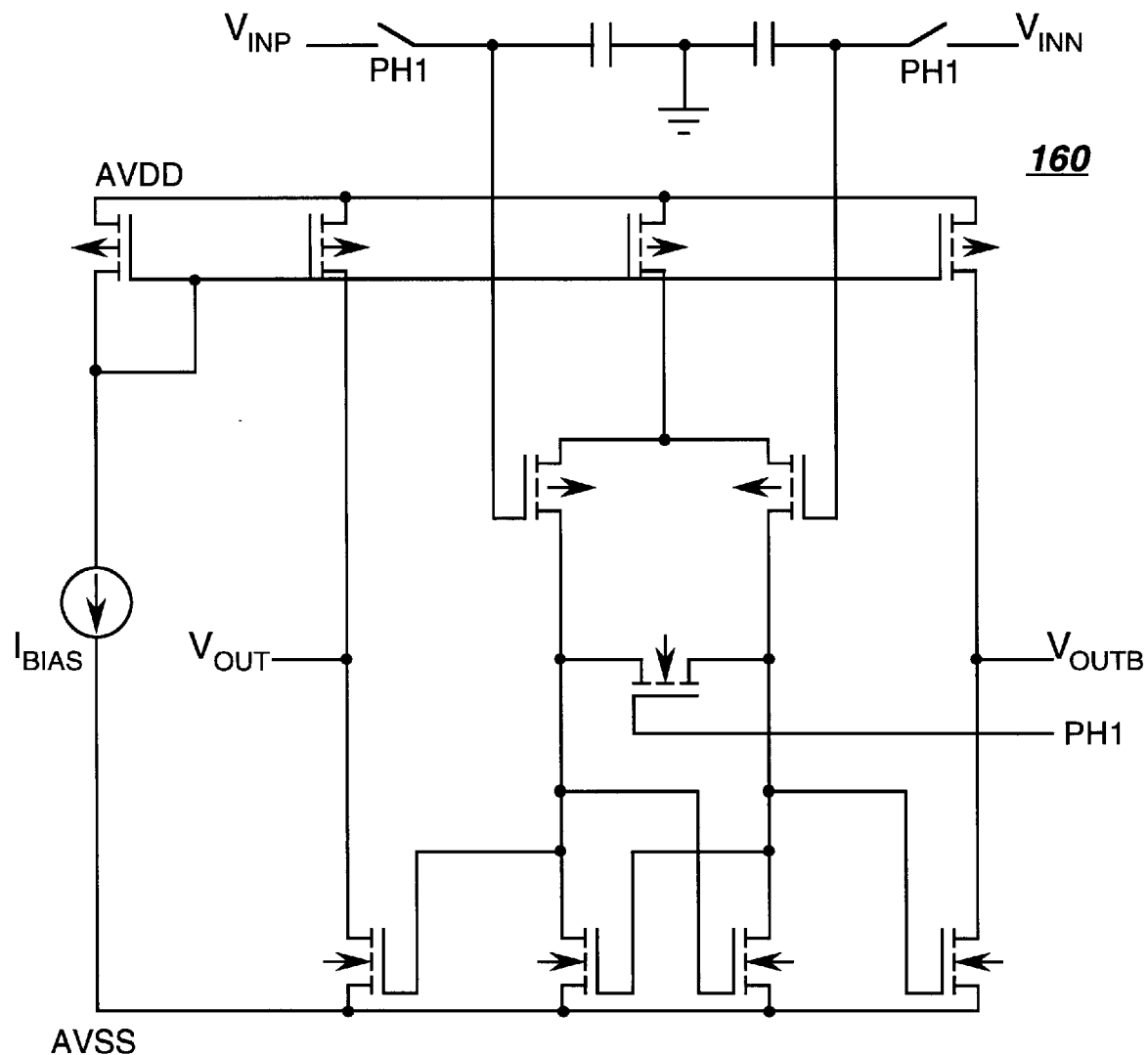
FIG. 13 is a schematic diagram of a fully differential comparator used in the SOFOC2 circuit illustrated in FIG. 4.

The SOFOC2 ADC test circuit 160, illustrated in FIG. 13, is designed to provide 16-bits of resolution and linearity when used at a clock rate of 5 million cycles per second (Msps) (and an OSR oversampling ratio of 128. The full scale input range is +/−0.884 volt (3 dB below the 1.25 volt reference). Sixteen bits of resolution requires that the ADC resolve 9.5 mV$_{RMS}$, which translates to an SNR of 96 dB. Sixteen bits of linearity requires the total harmonic distortion power be smaller than 91 pV$^2$, and this translates to an SDR of 96 dB. The 16-bit performance is expected over the industrial temperature range (−45 degrees C. to 85 degrees C.), power supplies of 4.5 to 5.5 volts, for bias currents 25% above and below nominal, for single ended and differential inputs, and over the process variations represented by the SPICE™ models for the 0.6 mm CMOS process used.

Figure 2:
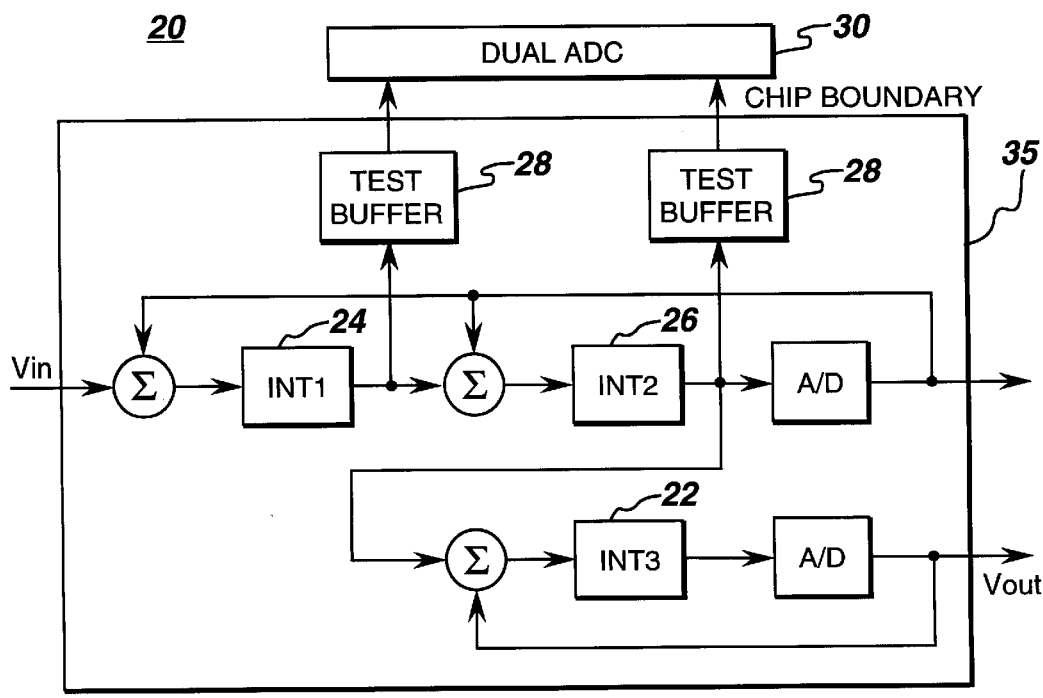
FIG. 2 is a block diagram of the in situ testing process of the present invention.
Figure 12A:
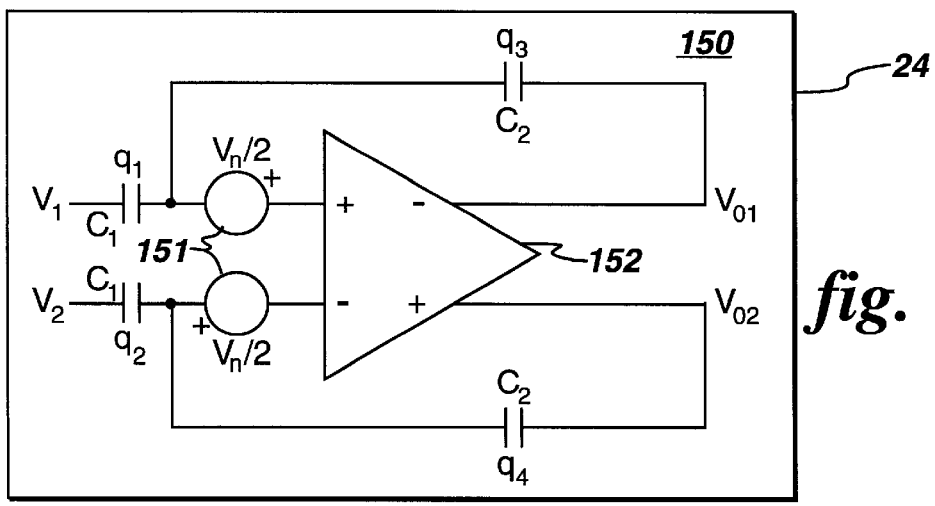
FIG. 12 is a schematic diagram of three integrators of the present invention.
Figure 12B:
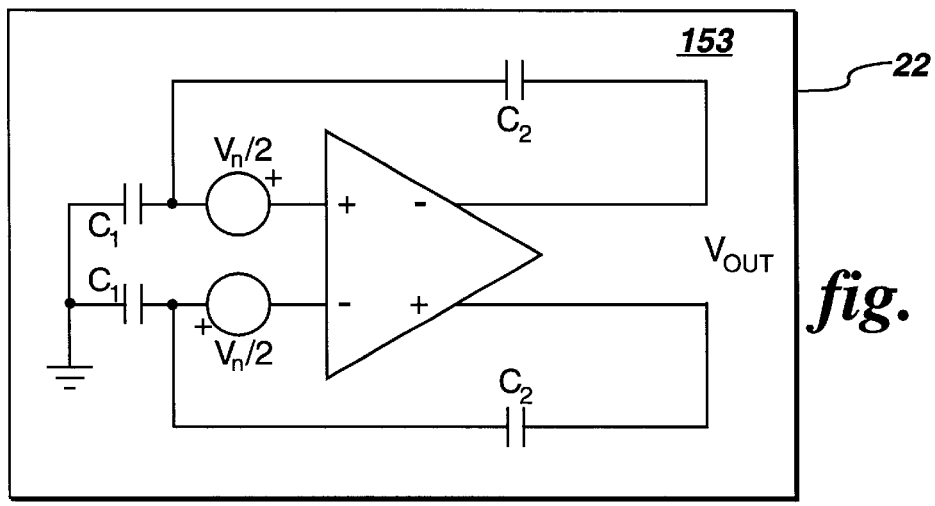
Figure 12C:
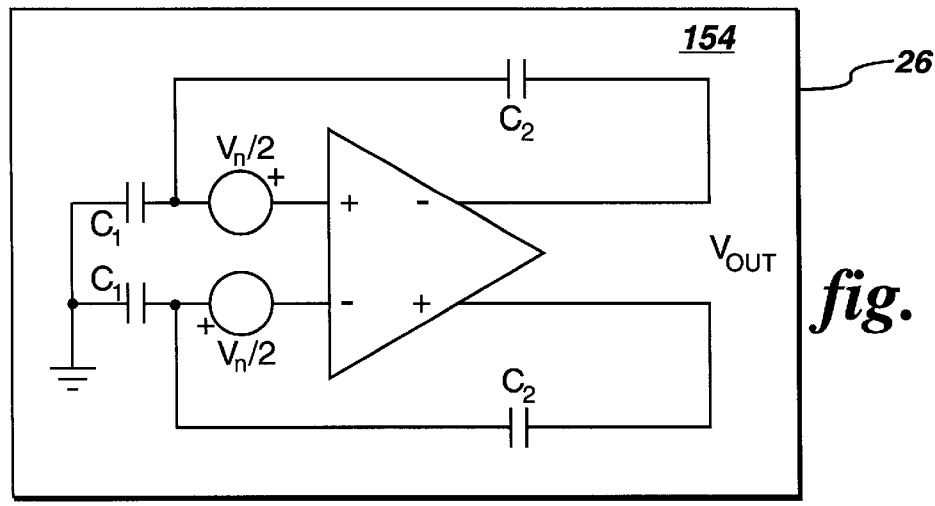

FIG. 12 shows circuit configurations 150, 153 and 154 of the double-rate sampling integrator for integrator 26, 22, and 24 of FIG. 2. Voltage sources 151 at the inputs of opamp 152 represent the opamp noise. The charge conservation analysis which follows yields the signal and noise transfer functions of the integrator The charge quantities on the capacitors $C_2$ in PH1 are:

$$q_1 = (V_1 - V_n/2)C_1 \qquad (20)$$

$$q_2 = (V_2 + V_n/2)C_1 \qquad (21)$$

$$q_3 = (V_{o1} - V_n/2)C_2 \qquad (22)$$

$$q_4 = (V_{o2} + V_n/2)C_2 \qquad (23)$$

The charge quantities on the capacitors $C_2$ in PH2 are:

$$q_1 = (V_2 - V_n/2)C_1 \qquad (24)$$

$$q_2 = (V_1 + V_n/2)C_1 \qquad (25)$$

$$q_3 = (V_{o2} + V_n/2)C_2 \qquad (26)$$

$$q_4 = (V_{o1} - V_n/2)C_2 \qquad (27)$$

When the clock changes from PH1 to PH2, the sum of $q_1$ and $q_4$ and the sum of $q_2$ and $q_3$ must be conservative, and leads to the following charge balance equations. The sum of $q_1$ and $q_4$ before and after the transition from PH1 ($z^{-1}$) to PH2 ($z^{-\frac{1}{2}}$) is shown below.

$$z^{-1}V_1C_1 - z^{-1}\frac{V_n}{2}C_1 + z^{-1}V_{O2}C_2 + z^{-1}\frac{V_n}{2}C_2 = \quad (28)$$
$$z^{-\frac{1}{2}}V_2C_1 - z^{-\frac{1}{2}}\frac{V_n}{2}C_1 + z^{-\frac{1}{2}}V_{O1}C_2 - z^{-\frac{1}{2}}\frac{V_n}{2}C_2$$

The sum of $q_2$ and $q_3$ before and after the transition from PH1 ($z^{-1}$) to PH2 ($z^{-\frac{1}{2}}$) is shown below.

$$z^{-1}V_2C_1 + z^{-1}\frac{V_n}{2}C_1 + z^{-1}V_{O1}C_2 - z^{-1}\frac{V_n}{2}C_2 = \quad (29)$$
$$z^{-\frac{1}{2}}V_1C_1 - z^{-\frac{1}{2}}\frac{V_n}{2}C_1 + z^{-\frac{1}{2}}V_{O2}C_2 - z^{-\frac{1}{2}}\frac{V_n}{2}C_2$$

Likewise, when the clock changes from PH2 to PH1, the sum of $q_1$ and $q_3$ and the sum of $q_2$ and $q_4$ must be conservative, and leads to the following charge balance equations. The sum of $q_2$ and $q_3$ before and after the transition from PH2 ($z^{-\frac{1}{2}}$) to PH1 is shown below.

$$z^{-\frac{1}{2}}V_2C_1 - z^{-\frac{1}{2}}\frac{V_n}{2}C_1 + z^{-\frac{1}{2}}V_{O2}C_2 + z^{-\frac{1}{2}}\frac{V_n}{2}C_2 = \quad (30)$$
$$V_1C_1 - \frac{V_n}{2}C_1 + V_{O1}C_2 - \frac{V_n}{2}C_2$$

$$z^{-\frac{1}{2}}V_1C_1 + z^{-\frac{1}{2}}\frac{V_n}{2}C_1 + z^{-\frac{1}{2}}V_{O1}C_2 - z^{-\frac{1}{2}}\frac{V_n}{2}C_2 = \quad (31)$$
$$V_2C_1 + \frac{V_n}{2}C_1 + V_{O2}C_2 + \frac{V_n}{2}C_2$$

The following signal definitions simplify the analysis.

$$V_{in} = V_1 - V_2 \quad (32)$$
$$V_{OUT} = V_{02} - V_{01} \quad (33)$$

Combining equations (29) and (30), $$z^{-1}V_{in}C_1 + z^{-1}V_nC_1 + z^{-1}V_{out}C_2 + z^{-1}V_nC_2 = \quad (34)$$
$$-z^{-\frac{1}{2}}V_{in}C_1 - z^{-\frac{1}{2}}V_nC_1 - z^{-\frac{1}{2}}V_{out}C_2 + z^{-\frac{1}{2}}V_nC_2$$

and combining equations (30) and (31).

$$-z^{-\frac{1}{2}}V_{in}C_1 - z^{-\frac{1}{2}}V_nC_1 + z^{-\frac{1}{2}}V_{out}C_2 + z^{-\frac{1}{2}}V_nC_2 = \quad (35)$$
$$V_{in}C_1 - V_nC_1 - V_{out}C_2 - V_nC_2$$

Combining equations (34) and (35) the integrator transfer functions for input and noise are shown below.

$$V_{out} = \quad (36)$$
$$\frac{V_{in}\left(1 + 2z^{-\frac{1}{2}} + z^{-1}\right)}{(1-z^{-1})} - V_n\left[\frac{\left(1 - z^{-1} + \frac{C_1}{C_2} - 2\frac{C_1}{C_2}z^{-\frac{1}{2}} + \frac{C_1}{C_2}z^{-\frac{1}{2}}\right)}{(1-Z^{-1})}\right]$$

Equation (36) shows that the first integrator input is scaled by a factor of four at DC, and the opamp noise is canceled at DC. The scaling of the input signal is important since it effectively decreases the effects of noise from opamp 152 (FIG. 12) and switches by a factor of four. The cancellation of DC offset of the opamp 152 is also important since CMOS amplifier circuits can have offsets in the milli-volt range representing many least significant bits (LSBs) of the ADC. The offset cancellation is accomplished by the chopper stabilization action of the integrator switches. The inputs and outputs of opamp 152 are swapped each half clock period, which modulates the offset and flicker noise of the opamp to the sample frequency of 5 MHz.

The signal transfer function is that of an integrator as expected. The noise transfer function integrator has unity gain except near DC and the clock rate of 5 MHz. When the opamp noise is referred to the input of the integrator, it is differentiated and severely attenuated in the low frequency base-band, which minimizes the effect of opamp noise in the modulator.

The spectral peak at 5 MHz is attenuated by the sampling of the second integrator which introduces a zero at the 5 MHz modulator sample rate. The reduction of the chopped noise is made possible by the double-rate integrator followed by a single-rate sampling circuit. The double-rate sampling has the advantages of minimizing the impact of opamp noise from the first integrator opamp and reducing the effects of noise from the sampling switches by a factor of four.

The first 24, second 26, and third 22, integrators illustrated in FIG. 12 are substituted for the integrators 22, 24, and, 26, illustrated in FIG. 2. The difference equation are written by inspection as shown below.

$$V_{out} = z^{-1}V_{out1} + z^{-1}V_{in}C_1/C_2 + z^{-\frac{1}{2}}V_n(1 + C_1/C_2) + V_n \quad (37)$$

The resulting signal and noise transfer functions are shown below.

$$V_{out} = V_{in}\frac{C_1}{C_2}\frac{z^{-1}}{(1-z^{-1})} - V_n\left[\frac{\left(1 + \left(1 + \frac{C_1}{C_2}\right)z^{-\frac{1}{2}}\right)}{(1-z^{-1})}\right] \quad (38)$$

The signal and opamp noise are both integrated by the integrator circuit used for the second and third integrators 26 and 22 respectively. The implication is that the noise refers directly back to the input of the integrator with some scaling factor based upon the ratio of the input and integration capacitors. The reason that this is acceptable is that integrators 22 and 26 are preceded by the first integrator 24 such that their noise contribution is attenuated when referenced at $V_{in}$.

A noise budget was constructed to account for known noise sources. The noise allocation was used to determine the allowable opamp noise, switch related thermal noise, and integrator settling related noise. The next section contains the analysis used to determine the noise budget and the requirements for the integrator subcircuits.

Noise in SOFOC2 modulator 70 (FIG. 4) is due to quantization, switches, clock jitter, power supply coupling, substrate coupling, and transistors used in the opamps. An estimate of the maximum allowable noise for each of these sources was made and is outlined in the following paragraphs and summarized in Table 6.1. It is expected that the noise sources are uncorrelated and thus add in quadrature.

TABLE 6.1

Noise Allocations for SOFOC2 Sigma-Delta Modulator Test Circuit

| Noise Source | Noise Contribution |
| --- | --- |
| Quantization | 6.1 mV |
| Switches | 2.3 mV |
| Clock Jitter | 2 mV |

TABLE 6.1-continued

Noise Allocations for SOFOC2 Sigma-Delta Modulator Test Circuit

| Noise Source | Noise Contribution |
| --- | --- |
| Power Supply Coupling | 1 mV |
| Substrate Coupling | 1 mV |
| Opamp in First Integrator | 1 mV |
| Opamp in Second Integrator | 4.5 mV |
| Opamp in Third Integrator | 0.3 mV |
| Total | 8.3 mV, SNR = 97.5 dB |

Noise arises from the comparators whose quantization error is spectrally shaped by the modulator quantization noise transfer function. The quantization noise of SOFOC2 modulator 70 at an OSR of 128 is ideally 0.8 mV or 118 dB below the maximum useable input signal. The quantization noise is increased due to mismatches in the capacitor ratios which perform integrator scaling, and from integrator errors due to incomplete settling and opamp non-linearity. The sigma-delta difference equation simulator was used to determine the effect of capacitor mismatch on quantization noise. From simulations of the modulator with +/−0.3% mismatch in integrator scaling coefficients, which represents the maximum capacitor mismatch expected, it was determined that the quantization noise can degrade to as high as 3.5 mV.

The increase in quantization noise due to integrator non-linearity is difficult to analyze accurately. Noise generated by integrator errors can be modeled by broadband white noise at the integrator outputs spread over half the sample rate with density, $$\overline{V}^2_{ns} = \epsilon^2_{max}/3F_s \qquad (39)$$

where $F_s$ is the sample frequency and $e_{max}$ is the maximum settling error.

Equation (39) was used in conjunction with the signal transfer functions, and the settling related noise contributions determined for the three integrators 71, 72, and 73 (FIG. 4). The first integrator 71 was allocated 5 mV of noise which corresponds to a maximum settling error of 652 ppm (parts per million). The second and third integrators 72 and 73 contribute virtually zero noise for reasonable settling levels due to the high level of noise shaping when referred to the modulator input.

The sampling of a voltage onto a capacitor through a switch with finite resistance imparts a noise voltage onto the sampled signal known as "kT over C" noise and is described by the following equation.

$$\overline{V}^2_{nKTC} = kT/C \qquad (40)$$

The capacitor has value "C", "T" is the absolute temperature, and "k" is Boltzmann's constant. The resulting noise is white and spread over half the sample rate. Oversampling reduces the noise power by the OSR since only this fraction of the noise exists in the post-decimation bandwidth.

The input sampling capacitors were chosen to be 1 pF such that 0.5 pF unit capacitors could be used in a back-to-back fashion for the first integrator sampling capacitors to maximize the linearity of input sampling. The 0.5 pF unit capacitance was chosen to ensure good capacitor matching throughout the test circuit. The switch thermal noise was calculated for the 1 pF input sampling capacitors and 2 pF reference sampling capacitors. The resulting noise was referred to the input by dividing by four, and is 2.3 mV. The second and third integrators 26 and 22 contribute virtually no kT over "C" noise due to the spectral shaping when referred to the modulator input.

The clock signals controlling the switches which sample the input signal may be noisy or have uncertainty associated with their timing. The term sampling jitter noise is associated with noise induced by the uncertainty of signal sample time. Assuming a sine-wave input signal of frequency f and amplitude A, the maximum change in voltage per unit time is, $$dV_{in}(0)/dt = 2\pi f A \qquad (41)$$

and the standard deviation in the sampled voltage $(s_v)$ given the standard deviation in the sample time $(s_t)$ is shown below.

$$\sigma_v = 2\pi f A \sigma_t \qquad (42)$$

It was estimated that the worst case sampling standard deviation would be 200 psec., so for a full-scale signal at the 20 KHz maximum signal frequency, the pre-decimation jitter induced noise is 22.0 mV. Due to oversampling, this noise is attenuated by the square root of the oversampling ratio resulting in 2.0 mV of jitter induced noise.

Noise coupled from power supplies or through the substrate is difficult to estimate analytically. The best estimate is based upon the circuit topology and data reported in previous designs and in the literature. For the purpose of estimation, it will be assumed that the power supplies are decoupled such that 100 mV of noise is contained only in the signal bandwidth and aliasing is not significant. If we assume that the 100 mV of power supply noise is white in the base-band and the circuit has 80 dB power supply rejection ratio (PSRR) then there is less than 0.27 mV noise contribution when the noise is referred to the input and integrated over the signal bandwidth. The impact is smaller if the noise density is higher at lower frequency, since there is noise shaping when referred to the modulator input.

Noise in the substrate is more difficult to analyze since it is highly layout dependent and can couple into any point in the circuit including the input. The major source of substrate noise is due to switching transients and can be on the order of tens of milli-volts peak with a time constant in the low nanoseconds. Since the substrate currents will tend to be periodic with the clock, aperture jitter causes aliasing of the noise to base-band. In order to minimize the effects of transients, matched transistors (especially the input differential pair), input capacitors and input switches should be made close together. Digital switching sources should be placed as far away as feasible from the sensitive circuitry. Guard diffusion rings should be used around sensitive circuitry, and the timing of control signals should be such that they allow substrate current transients to settle before accurate voltages are held or compared.

In an effort to estimate substrate noise, the following calculation was done. If there is a 25 mV peak noise spike induced with a time constant of 2.2 ns, after 98 ns (one half clock period at 5 MHz) the transient has settled to 1e−19 volts. The fully differential nature of the circuit helps reject substrate noise coupling of closely spaced transistors. With careful layout this noise level should be achieved.

From the signal and noise transfer functions, the transfer functions for the opamp noise referred to the modulator input were calculated. Due to the zeros at DC, the flicker noise for the three opamps have virtually no impact on the modulator noise. The most significant noise is the thermal noise which aliases to base-band due to the sampling of the full noise bandwidth of the opamps. The aliased noise is calculated as, $$\overline{V}_n^2 = \frac{\pi f_c}{2 f_s} \int_0^{NBW} H_n^2(f) S_n^2(f) df \quad (43)$$

where $H_n(f)$ is the noise transfer function referred to the input, $S_n(f)$ is the spectral density of the opamp noise, $f_c$ is the opamp unity gain frequency, $f_s$ is the modulator sample rate, noise bandwidth (NBW) is equal to the 20 KHz signal bandwidth, and the factor of p/2 accounts for opamp gain roll-off.

The maximum opamp noise contribution was calculated for each integrator 22, 24, and 26 using the noise transfer functions, an opamp unity gain frequency of 80 MHz and a white noise spectral density of $0.9V^2/Hz$, both reasonable estimates for OTAs used in switched capacitor circuits of this speed. The resulting noise contributions total less than 5 mV and are listed in Table 6.1.

The three integrator circuits were designed to meet the noise requirements of Table 6.1. Each integrator consists of an opamp, capacitors, and switches. The opamps consume the most power and take significant silicon area, and therefore require the most attention in design. The design considerations for the capacitors are symmetry, and the use of back-to-back capacitors for input signal sampling in the first integrator to minimize the impact of capacitor non-linearity. The considerations for the switches are sizing for sufficient settling, and matching for charge injection and clock feed-through suppression.

The opamp used in the three integrators is a fully differential folded active cascode OTA (operational transconductance amplifier). This opamp circuit is often used in switched capacitor circuits since the only high impedance node is the opamp output, which makes compensation by the integration capacitor convenient. The amplifier has an input differential pair biased by a constant current. Input voltage change causes change in the currents of the input transistors. The difference in current in the input pair is reflected to the output conductance resulting in voltage gain. The gain is dependent mainly on the input pair transconductance and the output node impedance. The amplifiers forming the active cascodes boost the output impedance such that high gains can be achieved, despite large currents in the output devices required for settling. The output common mode voltage is held by the common mode feedback amplifier.

The choice of opamp bias current and transistor sizes is driven by the settling and noise requirements. The following analysis was used to determine the opamp transconductance required in the first integrator for settling to the 652 ppm level determined in the noise budget section. The size of the load capacitance on the first integrator is determined by the sampling, reference and integration capacitors. These capacitors are a load of approximately 5 pF on both opamp outputs, assuming a 10% bottom plate parasitic capacitor on the 24 pF integration capacitor. The 90 ns clock period where settling must be accomplished is divided between stewing and linear settling. The amplifier is allowed to slew for a maximum of 12.5 ns which requires a current of 200 mA in the output stage of the opamp to slew the 5 pF load capacitance which corresponds to bias current ($I_{bias}$) of 50 mA. The remaining 77.5 ns is for linear settling, and the transconductance required is calculated as follows.

$$652 \, ppm = e^{-\frac{t}{\tau}} \quad (44)$$

$$\frac{t}{\tau} = 6.5 \quad (45)$$

Since t=65 ns and the gain bandwidth (GBW) is equal to 1/t, $$GBW = 6.5 / 77.5 \, ns = 83.9 \, Mrad/sec. \quad (46)$$

resulting in a required transconductance ($g_m$) for the input devices as shown below.

$$g_m = GBW \times C_{load} = 0.42 \, mS \quad (47)$$

The opamp for the first integrator was designed with a transconductance of 1 mS to allow for the effect of the non-dominant pole on settling, and to take into account process variations. The opamp thermal noise resulting from this transconductance is approximately $0.017fV^2/Hz$, which is far below the $0.9fV^2/Hz$ required. The opamp used in the second and third integrators is a smaller version of that used in the first integrator. The transistor widths in these opamps were cut approximately in half and the bias current cut by a factor of 3. This scaling was done to save power and silicon area, with the knowledge that the settling requirements are much less severe for these integrators than for the first integrator. The resulting opamp designs meet the noise requirements listed in Table 6.1.

The integrator designs resulting from the design procedure described in the previous section were simulated to determine their performance and robustness. The first integrator was simulated with input conditions which generated the output voltage the maximum expected, and this condition was simulated for a full-factorial DOE with the levels and factors shown in Table 6.2. The factors in the DOE were NMOS and PMOS SPICE™ model strength, capacitance per unit area (C/A), and bias current. The simulations were performed at the highest temperature and lowest power supply voltages of interest as these were found to be the conditions of slowest settling.

TABLE 6.2

Levels and Factors of Full Factorial DOE Investigating Settling Robustness of First Integrator at High Temperature and Low Power Supply Voltage.

| Factor | Low Level | High Level |
| --- | --- | --- |
| NMOS Model Strength | Weak | Strong |
| PMOS Model Strength | Weak | Strong |
| C/A | 0.8 fF/mm² | 1.2 fF/mm² |
| Bias Current | 37.5 mA | 62.5 mA |

The settling errors for the sixteen simulations ranged from 4 ppm to over 30,000 ppm with only four cases satisfying the 652 ppm requirement. The original design based upon hand calculations is not robust for the environmental conditions of high temperature and low power supply voltage.

The bias current was increased to 100 mA nominal, and the DOE re-run with bias current ranging from 75 mA to 125 mA. The result was that the settling errors dropped significantly. The maximum settling error decreased to 47 ppm. The improved design meets the criteria for settling, and is robust with respect to environmental, operational, and manufacturing variations.

The second and third integrators were evaluated in a similar manner to the first integrator. The second integrator had settling errors less than 552 ppm, while the settling for the third integrator was better than 200 ppm. The settling of these integrators is expected to be far better than required as discussed in the noise budget section.

The comparators which perform the quantization at the outputs of the second and third integrators are required to make the proper binary decision in 90 ns, approximately one half period of the 5 MHz clock. The comparators do not need to resolve voltages on the order of an LSB of the converter, since noise and errors in the comparator decisions are spectrally shaped as are the settling errors of the second and third integrators. From simulations of the SOFOC2 modulator using the difference equation simulator discussed previously, it was discovered that errors greater than 10 mV are tolerated at each comparator with no degradation in SNR.

The comparator circuit 160 of FIG. 13 is used in the test circuit design for both comparators. Comparator 160 samples its input signal on PH1, and performs the comparison on PH2. The circuit 160 resolves to less than 1 mV over manufacturing variation, and over the temperature and power supply voltage ranges of interest according to SPICE™ simulations.

Figure 14:
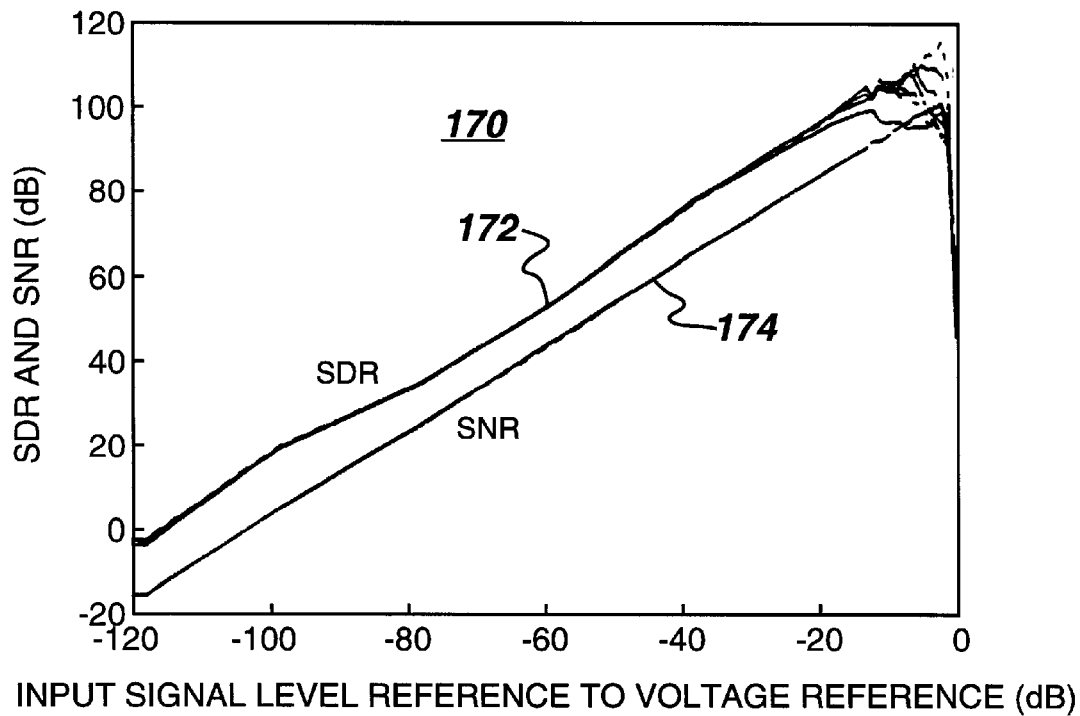
FIG. 14 is a plot of the simulated SDR and SNR for the SOFOC2 circuit illustrated in FIG. 4.

The SDR and SNR performance of the SOFOC2 test circuit was evaluated at an OSR of 128 as a function of input level using the extracted integrator non-linearities from the DOE of Table 3.1 in the difference equation sigma-delta simulator. White noise was added to the input signal for simulation of the expected thermal noise of the opamps and switches. FIG. 14 graphically illustrates how both SDR 172 and SNR 174 increase with signal level amplitude until the full scale level of the 1.25 voltage reference (0dB) is approached. The SDR 174 begins to decrease as the signal amplitude rises past 15 dB below the voltage reference, corresponding to increasing harmonic distortion. The SNR increases until the signal level is within 3 dB of the reference, at which time the SNR plummets due to overloading of the integrator outputs. The SNR and SDR for all cases of the DOE achieve SNR and SDR of approximately 96 dB at an input level 3 dB below the reference.

The modulator circuit was designed for testing over several operational conditions such that the predicted, simulated, and measured performance could be compared. The bias current for the first integrator is independently controllable. The bias currents for the second and third integrators are controlled together since the third integrator bias variation is a negligible effect on SDR and SNR. The common mode voltage for the first integrator is independently controllable so that the integrator output voltage can be raised or lowered toward the power supply rails, inducing non-linearity in the integrator output. The common mode output of the second and third integrators are controlled together to induce non-linearity in these integrator outputs. The impact on SDR and SNR of the third integrator non-linearity is insignificant. The test circuit SDR and SNR will be measured for a range of operating conditions. The measured results will be compared to simulated SDR and SNR, and that obtained using the genetic prediction equations generated using the genetic algorithm surface fits of the Signal-to-distortion and Signal-to-noise response sections.

A method for determining SDR and SNR prediction equation for sigma-delta modulator circuits 35 (FIG. 2) has been the focus of this invention. The method involves using a non-linear integrator model 60 (FIG. 3) to sample the non-linearity space of the integrators in the modulator 35. The samples contain information regarding what linearities can be tolerated in order to achieve the desired modulator performance. A high dimensionality surface fit method employing a genetic algorithm 80 (FIG. 5) operating on the samples discussed above is used to determine the prediction equations. The equations were used for predicting SDR 172 and SNR 174 (FIG. 14) of a SOFOC2 modulator test circuit 160 (FIG. 13) given the non-linearity of the integrators extracted from SPICE™ simulation.

The new non-linear integrator model presented in this specification captures the non-linearities due to input sampling and integration. The physical origin of these non-linearities were discussed and the model contrasted with existing non-linear integrator models. Data was presented which showed that the output of the mathematical integrator model accurately represents integrator characteristics based on SPICE™ simulations of the integrators. The coefficients of the integrator model non-linearity functions were also shown to contain information about the mechanisms causing the non-linearities.

The genetic algorithm 80 (FIG. 5) was introduced for fitting an equation to modulator instances sampled from the non-linearity space of the integrators. The algorithm performs a constrained optimization of the terms and associated coefficients used in the SDR and SNR prediction equations. The optimal terms which predict SDR and SNR are determined by the algorithm through the processes of natural selection on a population of evolving solutions. The algorithm was shown to converge to solutions which accurately predict SDR and SNR for modulators with integrator non-linearities within the numerical range of the samples used in the fit. The algorithm was demonstrated for quadratic and cubic surface fits, with the higher order cubic surface fit yielding slightly better prediction accuracy, as expected. It was determined that quadratic prediction equations are sufficiently accurate to be useful in the design of sigma-delta modulator circuits.

Three sampling methods which use the non-linear integrator model to sample the non-linearity space of the integrators were compared and contrasted. A simple geometrically based linear search sampling method was implemented, and the SDR and SNR prediction equations resulting from samples taken using this method were evaluated. It was found that this simple sampling algorithm under-samples some important regions of the integrator non-linearity space. The algorithm weights all non-linearities equally as the space is searched, and since the modulator SDR is significantly more sensitive to non-linearity due to input sampling, regions where non-linearity due to integration plays a significant role are under represented. The impact of under-sampling is that gross SDR prediction errors result. In the case of the SNR prediction equation, the linear search sampling method did not show the problem exhibited in the sampling for the SDR predictor. The reason for the observed difference in applicability is that unlike for SDR, there is not one non-linearity function which dominates SNR performance. The SNR performance is similarly sensitive to first and second integrator non-linearity resulting from integration, and slightly more sensitive to second integrator input sampling non-linearity. This attribute gives each function reasonable opportunity to affect SNR performance and be represented in the sampled data.

An improved linear sampling method was introduced, which overcomes the under-sampling problem observed with the linear search sampler. An improved linear search sampling method applies a random weighting to the integrator non-linearity functions prior to linear search. This weighting has the effect of occasionally biasing the weaker functions such that they play a more significant role in determining the SDR and SNR. The improved method eliminated the gross prediction errors observed using linear search sampling, and achieved an accuracy of +/−0.5 dB for SDR prediction and +/−2 dB for SNR prediction near the region where the fit was performed.

A deficiency of linear search sampling and improved linear search sampling is that the range of non-linearity coefficient values sampled is not directly controllable. The linear search sampling and improved linear search sampling methods autonomously determine the range of values over which sampling is performed. In cases where the sample space of several independent variables is being sampled, the range of interest for the independent variables is often known a priori. Such is the case for the range of integrator non-linearity in a sigma-delta modulator. The range of non-linearity values is easily obtained from several SPICE™ simulations of the integrators for use in the sigma-delta with various bias currents, power supply voltages, and SPICE™ model strengths.

A sampling method where the range of non-linearity coefficients can be directly controlled is desirable, and Gibbs sampling provides this control. The background of the Gibbs sampler was discussed, and a Gibbs sampler implemented for sampling the integrator non-linearity space. The Gibbs sampler was shown to converge to the desired SDR and SNR distributions, and to contain samples with non-linearity coefficients in the ranges of interest. The Gibbs sampler was shown to automatically narrow the non-linearity coefficient distributions of the highly sensitive variables, while keeping the distributions of less sensitive variables as specified. The Gibbs sampler was shown to yield results with accuracy equivalent to that obtained using improved linear search sampling. The Gibbs sampler was shown to be a powerful technique for sampling the integrator non-linearity space for the prediction of sigma-delta SDR and SNR.

The design of a SOFOC2 third order modulator test circuit was described, and the circuit fabricated and tested. The SDR and SNR prediction equations determined in the body of the specification were applied to predicting the SDR and SNR of the test circuit over several operational conditions. The predicted SDR and SNR were compared to the results from modulator simulation using integrator non-linearity coefficients extracted from integrator SPICE™ simulations and used with the non-linear integrator model. The predictions were also compared to that measured from the test circuit. Considering the loss of prediction accuracy away from the region of the fit, the SDR and SNR from the prediction equations showed good agreement with simulated SDR and SNR for integrator non-linearity coefficients in the range over which sampling was performed. Considering measurement limitations, loss of accuracy away from the fit region, and parasitic uncertainties, the predicted and simulated SDR and SNR were reasonably close to the measured performance over several operational conditions when the modulator was not in an overload condition. In cases where the SDR or SNR were severely degraded due to modulator overload, the prediction equations predicted a severe reduction in performance with a reduced accuracy. The loss of prediction accuracy in an overload condition is due to the integrators operating sufficiently outside the range of inputs and integrator initial conditions over which they were simulated. Another source reducing accuracy in these cases is the presence of oscillation in the common-mode feedback circuits of the integrators, which causes premature overload.

The agreement between simulated and measured modulator performance suggests that the BSIM3 models used to simulate the integrators combined with circuit techniques to minimize the impact of poorly modeled phenomena, such as channel-charge injection, are sufficient to predict modulator performance with reasonable accuracy. The ability to accurately predict integrator linearity using SPICE™ simulation enables the accurate prediction of SDR and SNR based upon integrator simulation results. The predictors are less accurate away from this region, but are monotonically related to simulated performance. Although the predictors are less accurate away from the region of the fit, the accuracy is most critical near the fit region since in this region decisions are made regarding sufficiency of the performance with respect to the target SDR or SNR.

The existence of the non-linear integrator model introduced in this specification which models non-linearity due to input sampling and integration provides designers of sigma-delta circuits with insight into areas where improvements are best made in the circuit to improve integrator linearity. The use of the non-linear integrator model in place of table look-up simulation methods gives designers useful information on how to improve modulator performance. When the non-linear integrator model is used to model the integrators in place of a table look-up in an automated sigma-delta optimization procedure 40 (FIG. 15), an improvement is expected in the number of optimization iterations required since the information regarding the type of non-linearity dominating the sigma-delta performance can be used to more effectively guide the required design changes.

Prediction equations which use integrator non-linearity coefficients to calculate SDR and SNR were determined. These equations accurately predict SDR and SNR near the region where the fit was performed. The predictors underestimate SDR and SNR away from the region of the fit due to the inability to fit the responses over a large portion of the response space using a polynomial fit. When used in circuit optimization the lack of accuracy is unimportant, since the monotonic nature away from the region of the fit allows performance gradients to be determined and used in optimizing the circuit.

The existence of equations which accurately predict the SDR and SNR of a high order modulator from simulation of the integrators eliminates the need for simulating the modulator during the optimization of the integrator circuits. The elimination of modulator simulation obviates a step in an automated modulator optimization procedure. The modulator optimization loop comprises integrator SPICE™ simulations, model coefficient extraction, and equation evaluations, followed by design modification. The model coefficient extraction and equation evaluation eliminates approximately seven million multiplications and additions compared to difference equation simulation using non-linear integrators. The time required for integrator circuit simulations dominates iteration time in the optimization method. Since the circuit simulations are performed over one modulator clock cycle and can be accomplished in approximately the same time as a difference equation simulation with 65,536 clock cycles, the use of the SDR and SNR prediction equations cuts the optimization iteration time by approximately a factor of two. The use of the non-linear integrator model in the optimization procedure is expected to reduce the number of iterations required to reach the desired SDR and SNR since the non-linearity coefficients contain information which can be used to more effectively guide design optimization compared to a procedure using table look-up models.

The ability to predict SDR and SNR using integrator non-linearity from simulation can be extended to reducing test time for sigma-delta modulators. Sigma-deltas are typically tested using input of a known signal and calculating the FFT of the modulator output. This test method is time consuming and adds significant cost to a multi-channel ADC integrated circuit because 65,536 modulator outputs must be serially captured and an FFT calculated from the data. The prediction equations determined in this specification can be applied to linearity data obtained from in situ integrator testing illustrated in FIG. 2. The integrator data is obtained from measurement of integrator input and output voltages and comparator states as modulator 35 is run for approximately one hundred clock cycles. Gathering the integrator 22, 24, and 26 linearity data requires low noise linear readout buffers 28 to avoid corrupting and distorting the integrator characteristics. Two ADCs 30 are used to digitize the integrator output voltages at the end of the modulator clock period at the 5 MHz rate. Only the outputs of the first two integrators 24 and 26 are used since the third integrator 22 non-linearity does not significantly impact SDR and SNR. The measured integrator data may be used in place of the integrator SPICE™ simulation data to determine integrator non-linearity coefficients. The non-linearity coefficients are then used in the prediction equations described above.

The test method described above may reduce test time for a high resolution modulator by more than a factor of 655 based on the estimated 65,536 samples required to evaluate SDR and SNR for high resolution modulators 35 (FIG. 2). The reason for the large improvement in test time compared to improvement in design optimization iteration time is that the accurate SPICE™ simulations required in design are computationally intensive and limit the reduction on design iteration time. SPICE™ simulation of an integrator for one modulator clock period requires approximately the same amount of computer time as a 65,536 difference equation modulator simulation, and therefore limits the reduction in design iteration time to a factor of approximately two. There are no computationally intensive SPICE™ simulation to limit the reduction in test time. Measurement of integrator outputs for 100 modulator clock periods takes exactly 100 modulator clock periods. The test time is therefore reduced proportionally with the reduction of clock cycles required to determine SDR and SNR.

The methods developed in this specification contribute several new design methods to sigma-delta design modulator 35 (FIG. 2). The non-linear integrator model provides an alternative to table look-up based simulation, and provides information in the form of integrator non-linearity coefficients useful in guiding integrator design for achieving desired SDR and SNR performance. A comparison of methods for sampling a multi-dimensional parameter space is presented, and the utility and advantages of the Gibbs sampler demonstrated. The power of a simple and effective genetic algorithm optimizer was demonstrated in determining SDR and SNR prediction equations for the purpose of reducing design and test time of sigma-delta analog-to-digital converters.

The non-linear integrator model, sampling methods, and prediction equations determined using genetic algorithm 80 were verified by measuring the SDR and SNR for a sigma-delta test circuit for several operational conditions and comparing the measured results to those from simulation and the prediction equations. The SDR and SNR prediction methods reduce sigma-delta optimization time by more than a factor of two, and reduce sigma-delta test time by more than a factor of 600.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A method of determining the non-linearity and non-ideality of an analog-to-digital device under test, the device under test having at least one integrator, a respective non-linear integrator model, and non-linearity parameters, said method comprising the following steps:

generating a model data set from a plurality of simulations of the analog-to-digital device under test employing the respective non-linear integrator model wherein the respective non-linear integrator model comprises at least one polynomial equation;

generating an n-dimensional prediction equation corresponding to said model data set;

measuring the input response of each respective non-linear integrator to generate a respective input response test data set;

generating a plurality of numerical values for the non-linearity coefficients in the non-linear integrator model from said respective test data set; and determining the acceptability of the analog-to-digital device under test by solving said prediction equation using said plurality of numerical values as input values.

2. The method as recited in claim 1, wherein said step of determining the acceptability of the analog-to-digital device under test further comprises the step of selecting a respective region of a sufficiency surface corresponding to an acceptable signal-to-noise ratio (SNR) limit and corresponding to an acceptable signal-to-distortion ratio (SDR) limit of each respective integrator.

3. The method as recited in claim 1, wherein said step of generating a plurality of numerical values comprises the step of generating a respective set of polynomial coefficients corresponding with said respective input response test data set.

4. The method as recited in claim 3, wherein said step of generating a plurality of numerical values further comprises the step of using a Chebychev n-dimensional prediction function to generate a respective set of polynomial coefficients corresponding to said plurality of numerical values.

5. The method as recited in claim 1, wherein said step of generating a model data set comprises the step of using a Gibbs Data Sampling method.

6. The method as recited in claim 2, wherein said step of generating a model data set comprises the step of using a Linear Search Sampling method.

7. The method as recited in claim 6, further comprises the step of generating said model data set within a tolerance shell around said SNR and said SDR.

8. The method as recited in claim 2, wherein said step of generating a model data set comprises the step of using an Improved Linear Search Sampling method.

9. The method as recited in claim 8, wherein said step of using an Improved Linear Search Sampling method further comprises the step of generating said model data set within a tolerance shell around said SNR and said SDR.

10. The method as recited in claim 4, wherein said step of generating said plurality of numerical values further comprises the step of selecting a sub set of said n-dimensional polynomial coefficients having "M" terms, wherein said "M" terms correspond to coefficients having the greatest influence on the respective polynomial.

11. The method as recited in claim 1, wherein said step of generating a model data set employing the non-linear integrator model further comprises the step of using at least one model capacitor having input non-linearity.

12. The method as recited in claim 11, wherein said respective capacitor model is a switched capacitor model.

13. The method as recited in claim 1, wherein said step of generating a model data set employing the non-linear integrator model further comprises the step of using at least one model capacitor having integration non-linearity.

14. The method as recited in claim 13, wherein said respective capacitor model is a switched capacitor model.

15. The method as recited in claim 1, wherein said step of generating an n-dimensional prediction equation comprises the step of using a genetic algorithm to generate said prediction equation.

16. A method of designing an analog-to-digital device by determining the non-linearity and non-ideality of the design, the design having at least one integrator design model, a respective non-linear integrator design model, and non-linearity coefficients, said method comprising the following steps:
generating a model data set from a plurality of simulations of the analog-to-digital design employing the respective non-linear integrator design model wherein the non-linear design model comprises at least one polynomial equation;
generating an n-dimensional prediction equation corresponding to said model data set;
measuring the input response of each respective non-linear integrator design model to generate a respective input response test data set;
generating a plurality of numerical values for the non-linearity coefficients in the respective non-linear design model from said respective test data set; and
determining the acceptability of the analog-to-digital design by solving said prediction equation using said plurality of numerical values as input values.

17. The method as recited in claim 16, wherein said step of determining the acceptability of the design further comprises the step of selecting a respective region of a sufficiency surface corresponding to an acceptable signal-to-noise ratio (SNR) limit and corresponding to an acceptable signal-to-distortion ratio (SDR) limit of each respective non-linear integrator design model.

18. The method as recited in claim 16, wherein said step of generating an n-dimensional prediction equation comprises the step of using a genetic algorithm to generate said prediction equation.

19. The method as recited in claim 16, wherein said step of generating a plurality of numerical values comprises the step of generating a respective set of polynomial coefficients corresponding with said respective input response test data set.

20. The method as recited in claim 19, wherein said step of generating a plurality of numerical values further comprises the step of using a Chebychev n-dimensional prediction function to generate a respective set of polynomial coefficients corresponding to said plurality of numerical values.

21. The method as recited in claim 16, wherein said step of generating a model data set comprises the step of using a Gibbs Data Sampling method.

22. The method as recited in claim 17, wherein said step of generating a model data set comprises the step of using a Linear Search Sampling method.

23. The method as recited in claim 22, further comprises the step of generating said model data set within a tolerance shell around said SNR and said SDR.

24. The method as recited in claim 17, wherein said step of generating a model data set comprises the step of using an Improved Linear Search Sampling method.

25. The method as recited in claim 24, wherein said step of using an Improved Linear Search Sampling method further comprises the step of generating said model data set within a tolerance shell around said SNR and said SDR.

26. The method as recited in claim 20, wherein said step of generating said plurality of numerical values further comprises the step of selecting a sub set of said n-dimensional polynomial coefficients having "M" terms, wherein said "M" terms correspond to coefficients having the greatest influence on the respective polynomial.

27. The method as recited in claim 16, wherein said step of generating a model data set employing the non-linear integrator design model further comprises the step of using at least one model capacitor having input non-linearity.

28. The method as recited in claim 27, wherein said respective capacitor model is a switched capacitor model.

29. The method as recited in claim 16, wherein said step of generating a model data set employing the non-linear integrator design model further comprises the step of using at least one model capacitor having integration non-linearity.

30. The method as recited in claim 29, wherein said respective capacitor model is a switched capacitor model.

31. An apparatus for determining the non-linearity and non-ideality of an analog-to-digital device under test, the device under test having at least one integrator, a respective non-linear integrator model, and non-linearity parameters, said apparatus comprising:
means for generating a model data set from a plurality of simulations of the analog-to-digital device under test employing the respective non-linear integrator model wherein the non-linear integrator model comprises at least one polynomial equation;
means for generating an n-dimensional prediction equation corresponding to said model data set;
means for measuring the input response of each respective non-linear integrator to generate a respective input response test data set;
means for generating a plurality of numerical values for the non-linearity coefficients in the non-linear integrator model from said respective test data set; and
means for determining the acceptability of the analog-to-digital device under test by solving said prediction equation using said plurality of numerical values as input values.

32. The apparatus as recited in claim 31, wherein said means for determining the acceptability of the analog-to-digital device under test further comprises means for selecting a respective region of a sufficiency surface corresponding to an acceptable signal-to-noise ratio (SNR) limit and corresponding to an acceptable signal-to-distortion ratio (SDR) limit of each respective integrator.

33. The apparatus as recited in claim 31, wherein said means for generating a plurality of numerical values comprises means for generating a respective set of polynomial coefficients corresponding with said respective input response test data set.

34. The apparatus as recited in claim 33, wherein said means for generating a plurality of numerical values further comprises means for using a Chebychev n-dimensional prediction function to generate a respective set of polynomial coefficients corresponding to said plurality of numerical values.

35. The apparatus as recited in claim 31, wherein said means for generating a model data set comprises means for using a Gibbs Data Sampling method.

36. The apparatus as recited in claim 32, wherein said means for generating a model data set comprises means for using a Linear Search Sampling method.

37. The apparatus as recited in claim 36, further comprises means for generating said model data set within a tolerance shell around said SNR and said SDR.

38. The apparatus as recited in claim 32, wherein said means for generating a model data set comprises means for using an Improved Linear Search Sampling method.

39. The apparatus as recited in claim 38, wherein said means for using an Improved Linear Search Sampling method further comprises means for generating said model data set within a tolerance shell around said SNR and said SDR.

40. The apparatus as recited in claim 34, wherein said means for generating said plurality of numerical values further comprises means for selecting a sub set of said n-dimensional polynomial coefficients having "M" terms, wherein said "M" terms correspond to coefficients having the greatest influence on the respective polynomial.

41. The apparatus as recited in claim 31, wherein said means for generating a model data set employing the non-linear integrator model further comprises means for using at least one model capacitor having input non-linearity.

42. The apparatus as recited in claim 41, wherein said respective capacitor model is a switched capacitor model.

43. The apparatus as recited in claim 31, wherein said means for generating a model data set employing the non-linear integrator model further comprises means for using at least one model capacitor having integration non-linearity.

44. The apparatus as recited in claim 43, wherein said respective capacitor model is a switched capacitor model.

45. The apparatus as recited in claim 31, wherein said means for generating an n-dimensional prediction equation comprises the step of using a genetic algorithm to generate said prediction equation.

* * * * *